(12) United States Patent
Fetherson

(10) Patent No.: US 6,789,223 B2
(45) Date of Patent: Sep. 7, 2004

(54) METHOD FOR OPTIMIZING TEST DEVELOPMENT FOR DIGITAL CIRCUITS

(75) Inventor: R. Scott Fetherson, Pleasanton, CA (US)

(73) Assignee: R. Scott Fetherston, Pleasanton, CA (US)

(*) Notice: Subject to any disclaimer, the term of this patent is extended or adjusted under 35 U.S.C. 154(b) by 300 days.

(21) Appl. No.: 10/017,649

(22) Filed: Dec. 12, 2001

(65) Prior Publication Data

US 2003/0115526 A1 Jun. 19, 2003

(51) Int. Cl.[7] .............................................. G06F 11/00
(52) U.S. Cl. ..................................................... 714/738
(58) Field of Search ............................... 714/738, 739, 714/741, 742, 724

(56) References Cited

U.S. PATENT DOCUMENTS

| | | | | |
|---|---|---|---|---|
| 5,835,506 A | * | 11/1998 | Kuglin | 714/738 |
| 5,844,917 A | * | 12/1998 | Salem et al. | 714/724 |
| 5,875,198 A | * | 2/1999 | Satoh | 714/740 |

OTHER PUBLICATIONS

Eichelberger et al., "Structured Logic Testing," Computer Engineering, Edward J. McCluskey, Series Editor, 1991, p. 124–127.
http://www-3.ibm.com/chips/services/testbench/.
http://www.mentor.com/dft/.
http://www.mentor.com/fastscan/.

* cited by examiner

Primary Examiner—Christine T. Tu
(74) Attorney, Agent, or Firm—Dorsey & Whitney LLP

(57) ABSTRACT

The invention reduces test development time for a circuit by determining the longest delay through each circuit element input and output pin. The delays are determined by calculating a delay value metric for each input pin and output pin and by assigning a delay value metric to the respective pin. Branch depth and branch width values are calculated for each input and output pin, and branch width and branch depth values are assigned to the respective pin. A least slack path is determined from the delay metric values. A fault model defines criteria for detection of faults at each circuit element pin using a test vector and associates a delay with each detected fault. The fault model enables detection of more than a single fault by a test vector.

27 Claims, 30 Drawing Sheets

| | FIRST RANK OF LOGIC 414 | | | | | | | SECOND RANK OF LOGIC 416 | | | | | | | PRIMARY OUTPUTS | |
|---|---|---|---|---|---|---|---|---|---|---|---|---|---|---|---|---|
| | GATE 404-1 | | | | | GATE 404-2 | | | | | GATE 404-3 | | | | GATE 404-4 | | | |
| | WIRES | | INPUT PINS | | OUT PIN | WIRES | | INPUT PINS | | OUT PIN | WIRES | | INPUT PINS | | OUT PIN | WIRES | | INPUT PINS | | OUT PIN | | |
| PRIM. INPUT 402-1 – 402-5 | 412-1 | 412-2 | 406-1 | 406-2 | 408-1 | 412-4 | 412-5 | 406-3 | 406-4 | 408-2 | 412-3 | 412-6 | 406-5 | 406-6 | 408-3 | 412-7 | 412-8 | 406-7 | 406-8 | 408-4 | 410-1 | 410-2 |
| STEP 302 | 0 | | | | | | | | | | | | | | | | | | | | | |
| STEP 306 | 1 | 2 | 1 | 2 | | | | | | | | | | | | | | | | | | |
| STEP 308 | | | | | 3 | 1 | 1 | 1 | 1 | 2 | | | | | | | | | | | | |
| STEP 316 | | | | | | | | | | | 3 | 3 | 5 | 3 | 6 | 3 | 2 | 7 | 4 | 8 | 7 | |
| STEP 317 | | | | | | | | | | | | | | | | | | | | | | 9 |

FIG. 4B

| | FIRST RANK OF LOGIC 614 | | | | | | SECOND RANK OF LOGIC 616 | | | | | | | PRIMARY INPUTS | | | |
|---|---|---|---|---|---|---|---|---|---|---|---|---|---|---|---|---|---|
| | GATE 604-1 | | | | | | GATE 604-2 | | | | | | GATE 604-3 | | | | |
| | WIRES | | INPUT PINS | | OUT PIN | | WIRES | | INPUT PINS | | OUT PIN | | WIRES | | INPUT PINS | | OUT PIN |
| PRIM. OUT 610-1-2 | 612-1 | 612-3 | 606-1 | 606-2 | 608-1 | | 612-2 | 612-4 | 606-3 | 606-4 | 608-2 | | 612-5 | 612-6 | 606-5 | 606-6 | 608-3 |
| STEP 502 | 0 | | | | | | | | | | | | | | | | |
| STEP 508 | | | | | 1 | | | | | | | | | | | | |
| STEP 510 | | 3 | 2 | 2 | | | 2 | | | | | | | | | | |
| STEP 514 | | | | | | | | 2 | 3 | 3 | 2 | | | | | | |
| STEP 524 | | | | | | | | | | | | | 5 | 7 | 8 | 8 | |
| STEP 526 | | | | | | | | | | | | | | | | | 7 |

| PRIMARY INPUTS | | | |
|---|---|---|---|
| 602-1 | 602-2 | 602-3 | 602-4 |
| | | | |
| | | | |
| | | | |
| | | | |
| 9 | 9 | 5 | 5 |
| | | | |

FIG. 6B

| | | FIRST RANK OF LOGIC 814 | | | | | | SECOND RANK OF LOGIC 816 | | | | | | |
|---|---|---|---|---|---|---|---|---|---|---|---|---|---|---|
| | | GATE 404-1 | | | GATE 404-2 | | | GATE 404-3 | | | GATE 404-4 | | | |
| | PRIM. INPUT | INPUT PINS | | OUT PIN | INPUT PINS | | OUT PIN | INPUT PINS | | OUT PIN | INPUT PINS | | OUT PIN | PRIMARY OUTPUT |
| | 802-1-5 | 806-1 | 806-2 | 808-1 | 806-4 | 806-5 | 808-2 | 806-6 | 806-3 | 808-3 | 806-7 | 806-8 | 808-4 | 810-1-2 |
| STEP 702 | 1 | 1 | 1 | | 1 | 1 | | | | | | | | |
| STEP 708 | | | | 1 | | | 1 | | | | | | | |
| STEP 714 | | | | | | | | 2 | 1 | | 2 | | | |
| STEP 720 | | | | | | | | | | 2 | | 1 | 2 | 2 |

| | PRIM. OUTPUTS | | FIRST RANK OF LOGIC 1014 | | | | | | SECOND RANK OF LOGIC 1016 | | | | PRIMARY INPUTS | | |
|---|---|---|---|---|---|---|---|---|---|---|---|---|---|---|---|
| | | | GATE 1004-1 | | | GATE 1004-2 | | | GATE 1004-3 | | | | | | |
| | | | INPUT PINS | | OUT PIN | INPUT PINS | | OUT PIN | INPUT PINS | | OUT PIN | | | | |
| | 1010-1 | 1010-2 | 1006-1 | 1006-2 | 1008-1 | 1006-3 | 1006-4 | 1008-2 | 1006-5 | 1006-6 | 1008-3 | | 1002-1 | 1002-2 | 1002-3 |
| STEP 902 | 1 | 1 | | | | | | | | | | | | | |
| STEP 908 | | | 1 | 1 | | | | | | | | | | | |
| STEP 910 | | | | | 1 | 1 | 1 | | | | | | | | |
| STEP 918 | | | | | | | | 1 | | | | | | | |
| STEP 920 | | | | | | | | | 2 | 2 | 2 | | | | |
| STEP 922 | | | | | | | | | | | | | 2 | 2 | 2 |

| | PRIM. OUTPUTS | | FIRST RANK OF LOGIC 1214 | | | SECOND RANK OF LOGIC 1216 | | | | | | PRIMARY INPUTS | | |
|---|---|---|---|---|---|---|---|---|---|---|---|---|---|---|
| | | | GATE 1204-1 | | | GATE 1204-2 | | | GATE 1204-3 | | | | | |
| | | | INPUT PINS | | OUT PIN | INPUT PINS | | OUT PIN | INPUT PINS | | OUT PIN | | | |
| | 1210-1 | 1210-2 | 1206-1 | 1206-2 | 1208-1 | 1206-3 | 1206-4 | 1208-2 | 1206-5 | 1206-6 | 1208-3 | 1202-1 | 1202-2 | 1202-3 |
| STEP 1102 | | | | | | | | | | | | 1 | 1 | 1 |
| STEP 1104 | | | 1 | 1 | | | | | | | | | | |
| STEP 1106 | | | | | 1 | | | | | | | | | |
| STEP 1110 | | | | | | 3 | 3 | | 3 | 3 | | | | |
| STEP 1114 | | | | | | | | 3 | | | 3 | | | |
| STEP 1122 | 3 | 3 | | | | | | | | | | | | |

FIG. 12B

| | PRIM. OUTPUTS | | FIRST RANK OF LOGIC 1414 | | | | | | SECOND RANK OF LOGIC 1416 | | | PRIMARY INPUTS | | |
| | | | GATE 1404-1 | | | GATE 1404-2 | | | GATE 1404-3 | | | | | |
| | | | INPUT PINS | | OUT PIN | INPUT PINS | | OUT PIN | INPUT PINS | | OUT PIN | | | |
| | 1410-1 | 1410-2 | 1406-1 | 1406-2 | 1408-1 | 1406-3 | 1406-4 | 1408-2 | 1406-5 | 1406-6 | 1408-3 | 1402-1 | 1402-2 | 1402-3 |
|---|---|---|---|---|---|---|---|---|---|---|---|---|---|---|
| STEP 1302 | 1 | 1 | | | | | | | | | | | | |
| STEP 1308 | | | 1 | 1 | 1 | | | | | | | | | |
| STEP 1310 | | | | | | 1 | 1 | 1 | | | | | | |
| STEP 1320 | | | | | | | | | 3 | 3 | 3 | | | |
| STEP 1322 | | | | | | | | | | | | 3 | 3 | |
| STEP 1324 | | | | | | | | | | | | | | 3 |

FIG. 14B

| INPUT A | INPUT B | FAULT FREE DELAY |
|---|---|---|
| Ct OR NCt | Cs | PROPAGATION CEASES |
| Ct OR NCt | NCs | DELAY AT TRANSITION + GATE DELAY |
| Ct | Ct | LESSER OF 2 DELAYS + GATE DELAY |
| NCt | NCt | GREATER OF 2 DELAYS + GATE DELAY |
| NCt | Ct | PROPAGATION CEASES |

WHERE:

Ct = TRANSITION TO CONTROLLING
NCt = TRANSITION TO NONCONTROLLING
Cs = STATIC CONTROLLING
NCs = STATIC NONCONTROLLING

FIG. 20A

| INPUT A | INPUT B | FAULTY DELAY |
|---|---|---|
| Dc or Dnc | C | PROPAGATION CEASES |
| Dc or Dnc | NC | DELAY AT THE "D" INPUT + GATE DELAY |
| Dc | Dc | LESSER OF 2 DELAYS + GATE DELAY |
| Dnc | Dnc | GREATER OF 2 DELAYS + GATE DELAY |
| DBARc or DBARnc | C | PROPAGATION CEASES |
| DBARc or DBARnc | NC | DELAY AT THE "D" INPUT + GATE DELAY |
| DBARc | DBARc | LESSER OF 2 DELAYS + GATE DELAY |
| DBARnc | DBARnc | GREATER OF 2 DELAYS + GATE DELAY |
| Dc | DBARnc | PROPAGATION CEASES |
| Dnc | DBARc | PROPAGATION CEASES |

WHERE:

Dc = 1 IN GOOD MACHINE, 0 IN FAULTY MACHINE, 1 IS CONTROLLING
Dnc = 1 IN GOOD MACHINE, 0 IN FAULTY MACHINE, 0 IS CONTROLLING
DBARc = 0 IN GOOD MACHINE, 1 IN FAULTY MACHINE, 0 IS CONTROLLING
DBARnc = 0 IN GOOD MACHINE, 1 IN FAULTY MACHINE, 1 IS CONTROLLING

FIG. 20B

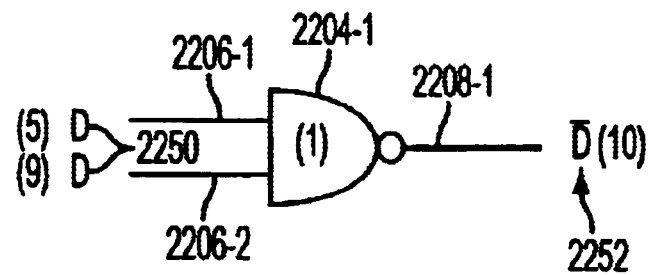
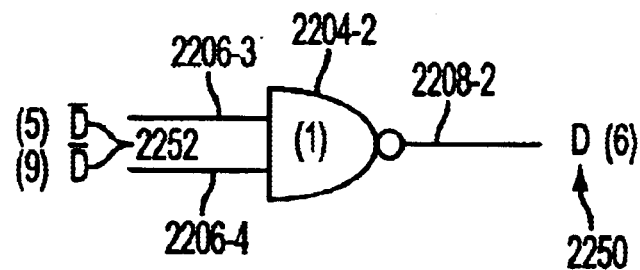
D = 1 IN FAULT FREE MACHINE, 0 IN FAULTY MACHINE
D̄ = 0 IN FAULT FREE MACHINE, 1 IN FAULTY MACHINE
FIG. 22

METHOD FOR OPTIMIZING TEST DEVELOPMENT FOR DIGITAL CIRCUITS

FIELD OF THE INVENTION

The present invention relates to structural tests for digital circuits in general, and more particularly to developing test patterns to detect timing-related failures in large digital integrated circuits.

BACKGROUND OF THE INVENTION

Digital integrated circuits (ICs) are commonly fabricated with complimentary metal-oxide semiconductor (CMOS) transistors. Modern fabrication techniques have allowed smaller and faster CMOS devices to be fabricated on an IC die. One result is that very sophisticated architecture can now be implemented, including for example microprocessors. But as digital ICs become increasingly more complex, it becomes more challenging using prior art testing methodologies to thoroughly and effectively test and evaluate ICs to ensure proper device function.

Structural tests are carried out on ICs to identify those which contain a manufacturing imperfection and are to be rejected. A test signal or pattern of test signals is coupled to an input pin of a device, a digital gate for example, and the resultant signal at the output device pin is examined. Each input and output of a gate is referred to herein as a pin, and can be used to connect via a wire to one or more other gate pins. A logical gate performs a Boolean operation, e.g., AND, OR, etc. by evaluating input signal voltage levels and by yielding an output that can be coupled as input to other gates. Gates are designed according to rules for a given process technology, and may be stored in a library for use by logic designers wishing to implement functional blocks.

Structural tests for use with digital ICs may be categorized as static or dynamic. A static failure is evidenced by an incorrect response from the device regardless of how slowly or rapidly the device is operated. When sampling voltage levels, static failures may be detected after application of a single test pattern of signals to the device. A dynamic failure is evidenced by an incorrect response when the device is operated at or near its operational speed. When sampling voltage levels, detecting dynamic failures requires application of a two-pattern sequence for their detection. In practice, several test techniques may be used to detect defective digital devices, using voltage or current measurements.

A series of tests intended to detect defective devices can be developed from a simulation model of the device that is typically developed at the gate level. A gate level netlist is one way of modeling the device at the gate level. A gate level netlist is a text file specifying the gates that are connected together by wires (or nets) to implement a given function.

Using prior art testing methodology, it is not possible to characterize all possible types of incorrect operation behavior resulting from manufacturing defects for a large or complex design. As a result, fault models have been created to try to cope with the problem, where a fault model is typically a gate level modeled simplified view of incorrect behavior. A fault model defines criteria for fault detection, and an effective fault model will provide coverage to detect many kinds of defects when used to produce tests.

Testing digital circuits for incorrect behavior involves using a pattern generator to provide a pattern of input values (or vectors) to target one or more fault sites, where "fault site" refers to a pin on a gate for which a test is developed to determine functionality. The term "fault site" does not necessarily mean there is something wrong with a given pin since every input and output pin is included in a complete fault list.

During early test stages, any pattern, whether random or specific to a certain fault site, may fortuitously detect many non-target fault sites. Fortuitous coverage of fault sites occurs when a vector satisfies criteria for fault detection on pins other than a target fault site. If the pattern covers a fault site then the fault site is said to be "detected" and the fault site is removed or "dropped" from the list of faults to be attempted or tested with the pattern generation process. Due to the nature of circuits, some fault sites are attempted but will not be detected. In practice, patterns are generated until all the fault sites on the list are either detected or attempted.

Several types of fault models are known in the relevant art. The "stuck-at fault" model is a widely used fault model for structural testing that detects a static fault. The stuck-at fault model assumes that a gate pin is stuck at a logic "0" or "1" voltage level. Detection of a stuck-at fault involves applying a single pattern that asserts a logic level opposite to the assumed stuck-at value, as well as other values to allow the propagation of the fault-effect to an observable destination. The term "detection of a stuck-at fault" does not mean that a problem exists with the fault site. Rather the term means that if a problem exists, the pattern applied to the netlist will detect the problem. The other values that allow propagation of the fault-effect are called "non-controlling" input states or values. When the pattern generator identifies a pattern or patterns that results in detection of a potential defect at a pin, that pin is then sensitized for the fault model. Unfortunately, one shortcoming with stuck-at fault testing is that timing related problems go undetected since the stuck-at test reveals only static failures.

Another fault model is the "transition fault" model, which can be thought of as a stuck-at fault model extended over a two-pattern sequence, or a test for dynamic failures. Two types of transition faults are considered to exist on input pins and output pins of logic gates. A slow-to-rise type transition behaves as a stuck-at-zero fault for some temporary period of time, and a slow-to-fall type transition behaves as a stuck-at one fault for some temporary period of time. Two distinct patterns applied successively are required to switch the transition fault site. The first pattern sets the fault site at a 1 or 0 logic level, and the second pattern sets the fault site to the complementary level. Additional values are present to allow successful propagation of an injected stuck-at fault at the fault site to an observable node. A test that targets a transition fault will detect a dynamic failure when the two-pattern sequence is applied with a delay between application of the first and second patterns approximating operational speed of the device. For the transition fault to be detected, the input or output pin of the fault site must change states (0-to-1 or 1-to-0) between the two-pattern sequence. Additionally, if the fault site is at an input pin, then all other input pins on that gate must have non-controlling states or values during the second of the two-pattern sequence. The transition fault on the input pin is considered detected if these two requirements are met and if the injected fault successfully propagates to an observable destination. Advantageously, transition fault modeling provides coverage information as to number of detected faults as a percentage of the total.

Although transition fault modeling can develop tests for timing related failures, the nature of the test is quantitative rather than qualitative. The ability of a transition fault model to sensitize a delay defect associated with the transition fault site is related to paths that can be tested through the transition fault site. Value propagation through a transition fault site can be sensitized on paths having a very short delay, also called "greatest slack", or on paths having a very long delay quite near the allotted time interval, or "least slack". If the transition fault is sensitized on a path with a short delay, such additional delay contributed by a defect may not be great enough to exceed the allotted time interval. In such case, the defect will escape detection even though it is identified for testing. The transition fault model not only marks transition faults detected when sensitized on short paths, it (by nature in its implementation in commercial tools) favors their sensitization on short paths. Consequently, transition fault modeling is less likely to identify the paths most in need of dynamic testing, which are the least slack paths.

A third fault model is the "path delay fault" model, a model that attempts detection of a least slack path. Unfortunately, in practice an unsensitized path is often produced during path generation. This results in prohibitive runtimes by the pattern generator for the paths supplied to it, since so many paths are unsensitizable and sensitizing path delay faults is more complex than sensitizing single stuck-at faults. Also, a path delay fault model does not provide a next least slack path to test in case a first path is untestable. Further, the pattern generation flow based on the path delay fault model is ill-equipped to provide a next least slack path in case the least slack path is untestable. The produced result is qualitative but not quantitative.

In summary, there is a need for improvement in structurally testing devices. In particular, there is a need for improvement of developing test patterns for detecting timing related failures in large digital ICs. Preferably such improved testing should provide qualitative and quantitative information for faults tested, should avoid exponential runtimes for path generation, and should identify least slack paths. Preferably the development of such test patterns should be carried out using existing software and hardware, and should reveal even small delay defects that might go undetected using prior art testing techniques. Preferably such testing should reliably extract the longest delay path through every pin on every gate in a device using two static traverses of a levelized gate netlist.

The present invention provides such a testing method.

SUMMARY OF THE INVENTION

The present invention provides test patterns to detect timing related failures in large digital ICs, to rapidly detect least slack paths. Such digital ICs typically include a plurality of gates, such that each gate has at least one input pin and at least one output pin. An output pin of a first gate is coupled to the input pin of a second gate through a wire. The present invention reduces the number of tests on the IC by determining the slowest path through the pins on the gates. This path is used to test the slowest path through each pin on every gate in the circuit. A delay value through each gate in the circuit is calculated, as well as a value for branch depth and a value for branch width. The invention determines a least slack path based on the delay, branch depth, and branch width. Further calculations are performed for reconvergent fanout and detection of fortuitous faults along one or more fanout-free regions.

The invention identifies a path (the least slack path) upon which a timing related error at a fault site is more likely to be triggered by a pattern intended to detect the fault site. The present invention also extends the functionality of a transition fault model by determining a delay value associated with a detected transition fault and thereby provides a qualitative measure of delay test coverage. A list of fault sites tested is produced, providing information as to the total degree of coverage. The development of such test patterns according to the present invention provides qualitative and quantitative information for faults tested, and avoids exponential runtimes for path generation. The present invention develops such test patterns using existing software and hardware, and can reveal small delay defects that might go undetected using prior art testing techniques. Such testing reliably extracts the longest delay path through every pin on every gate in a device using two static traverses of a levelized gate netlist.

Other features and advantages of the invention will appear from the following description in which the preferred embodiments have been set forth in detail, in conjunction with the accompanying drawings.

BRIEF DESCRIPTION OF THE DRAWINGS

FIG. 4b is a chart showing the forward delay metric values calculated according to the steps of FIG. 3 on the circuit of FIG. 4a, according to the present invention;

FIG. 6b is a chart showing the backward delay metric values calculated according to the steps of FIG. 5 on the circuit of FIG. 6a, according to the present invention;

FIG. 8b is a chart showing the forward branch depth values calculated according to the steps of FIG. 7 on the circuit of FIG. 8a, according to the present invention;

FIG. 10b is a chart showing the backward branch depth values calculated according to the steps of FIG. 9 on the circuit of FIG. 10a, according to the present invention;

FIG. 12b is a chart showing the forward branch width values calculated according to the steps of FIG. 11 on the circuit of FIG. 12a, according to the present invention;

FIG. 14b is a chart showing the backward branch width values calculated according to the steps of FIG. 13 on the circuit of FIG. 14a, according to the present invention;

FIG. 20a is a chart showing rules by which fault free delay metric values are calculated using the steps of FIG. 19, according to the present invention;

FIG. 20b is a chart showing the rules by which faulty delay metric values are calculated using the steps of FIG. 19, according to the present invention;

FIG. 22 shows a simplified schematic diagram demonstrating an application of the rules defined in FIG. 20 when calculating delay in the presence of reconvergent fanout;

DETAILED DESCRIPTION OF THE PREFERRED EMBODIMENTS

The exemplary embodiments are described herein with reference to specific configurations and designs. Those skilled in the art will appreciate that various changes and modifications can be made to the embodiments while remaining within the scope of the present invention.

Figure 1:
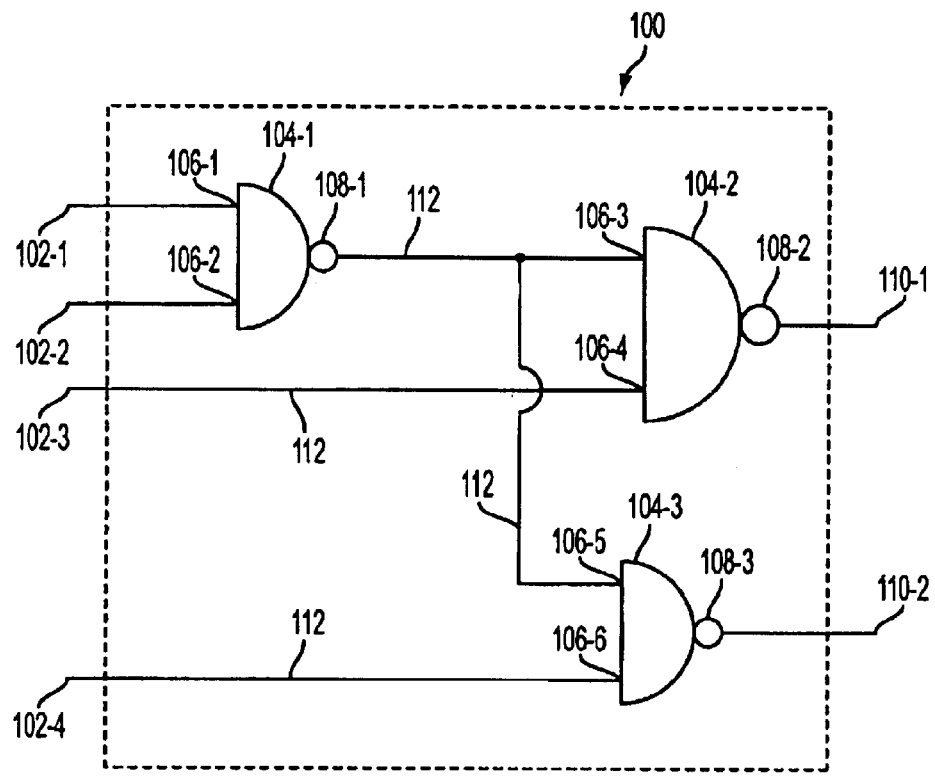
FIG. 1 is an exemplary circuit used to establish terms and definitions used herein.

FIG. 1 shows a portion of an exemplary gate level circuit design of a semiconductor chip 100 that can be analyzed with the present invention. The terms and definitions used to describe FIG. 1 will be used throughout the detailed description. Primary inputs 102-1, 102-2, 102-3, and 102-4 represent inputs of semiconductor chip 100, while primary outputs 110-1 and 110-2 represent outputs of the chip. Semiconductor chip 100 comprises NAND gates 104-1, 104-2, and 104-3, for example, in which gate 104-1 has input pins 106-1 and 106-2, gate 104-2 has input pins 106-3 and 106-4, and gate 104-3 has input pins 106-5 and 106-6. Excluding primary inputs 102 and outputs 110, generally an output pin from a NAND gate is coupled to an input pin of another NAND gate through a conductor or wire 12. For example, output pin 108-1 is coupled to input pins 106-3 and 106-5 through wire 112. Primary inputs 102-1, 102-2, 102-3, and 102-4 are coupled to input pins 106-1, 106-2, 106-4 and 106-6, respectively, through wire 112, and primary outputs 110-1 and 110-2 are coupled to output pins 108-2 and 108-3, respectively, through wire 112.

A forward traversal is an analysis of a circuit from primary inputs 102 to primary outputs 110. Conversely, a backward traversal is an analysis of a circuit from primary outputs 110 to primary inputs 102. As discussed above, a gate level netlist is one way of modeling the device at the gate level. The gate level netlist is a text file that specifies the gates that are connected together by wires (nets) that implement a given function. Below is shown a netlist for the circuit of FIG. 1.

```
module figure_1 (in_1, in_2, in_3, in_4, out_1,
  out_2);
  input in_1, in_2, in_3, in_4;
  output out_1, out_2;
  wire t_out;
  nand_2_x2 inst1 (.ZN (t_out), .A (in_1), .B (in_2));
  nand_2_x2 inst2 (.ZN (out_1), .A (in_3), .B (t_out)
  );
  nand_2_x2 inst3 (.ZN (out_2), .A (in_4), .B (t_out)
  );
endmodule
```

Circuit 100 is labeled as "figure_1" and the netlist lists the elements of the circuit. Specifically, the netlist show the circuit including primary inputs "in_1" (102-1), "in_2" (102-2), "in_3" (102-3), "in_4" (102-4); primary output "out_1" (110-1) and "out_2" (110-2); a wire "t_out" (112); and three NAND gates "inst1" (104-1), "inst2" (104-2), "inst3" (104-3), with the pins of each NAND gate and to which other elements the pins couple, where ZN is the output pins, and A and B are the input pins. A standard delay format (SDF) text file may also be utilized to designate delays through components and elements of a circuit for modeling devices at the gate level. Below is shown a portion of an SDF file for the circuit of FIG. 1.

```
(CELLTYPE "fig_1")
(INSTANCE)
(DELAY
 (ABSOLUTE
  (INTERCONNECT in_4 inst3/A
   (1.000:2.000:3.000))
  (INTERCONNECT inst1/ZN inst3/B
   (3.000:4.000:5.000))
  (INTERCONNECT in_3 inst2/A
   (2.000:3.000:4.000))
  (INTERCONNECT inst1/ZN inst2/B
   (2.000:3.000:4.000))
  (INTERCONNECT in_1 inst1/A
   (0.500:1.000:1.500))
  (INTERCONNECT in_2 inst1/B
   (0.500:1.000:1.500))
 )
```

-continued

```
)
)
(CELL
(CELLTYPE "nand_2_x2")
(INSTANCE inst3)
(DELAY
(ABSOLUTE
(IOPATH A ZN (1.000:1.000:1.000)
(1.000:1.000:1.000))
(IOPATH B ZN (1.000:1.000:1.000)
(1.000:1.000:1.000))
   .
   .
   .
```

The SDF file provides delay information for the elements and wires for the circuit 100. The sections labeled "INTERCONNECT" define the wire delays between gate pins, primary inputs and primary outputs, with the fast, medium and slow delay times listed in parentheses. The "IOPATH" lists the delays for the NAND gates between each of the input pins A and B to the output pin ZN, with the fast, medium and slow risetimes in the first parentheses and the fast, medium and slow falltimes in the second parentheses. The delay values listed above are utilized in reference to FIG. 6A described below, where the delay values are listed in parentheses.

The term fanout defines the number of input pins to which an output pin of a gate connects. For example, output pin 108-1 has a fanout of two because it is coupled to two input pins, 106-3 and 106-5. If output pin 108-1 coupled to only one input pin then its fanout would be one, and if an output pin coupled to a primary output then the fanout would be one. A fanout-free region is one where the output pin of each gate of the region leads only to one gate each. In other words, the output pins do not branch out and lead to more than one gate each.

A rank of logic is defined in either a forward or a backward direction with respect to a given circuit. A rank of logic for a forward traversal of a circuit starts with primary inputs 102. Each gate 104 for which all input pins 106 are directly coupled to primary inputs 102 comprises the first rank of logic. In FIG. 1, primary inputs 102-1 and 102-2 couple directly to input pins 106-1 and 106-2, therefore gate 104-1 is in the first rank of logic. Both gates 104-2 and 104-3 have input pins 106-3 and 106-5 that are not directly coupled to primary inputs 102, so gates 104-2 and 104-3 are not in the first rank of logic. All gates 104 in chip 100 are accounted for, so the first rank of logic is complete and gate 104-1 is in the first rank of logic. The next rank of logic is comprised of gates 104 whose input pins 106 are coupled to primary inputs 102 or to output pins 108 of a gate in the previous or last completed rank of logic. In FIG. 1, gates 104-2 and 104-3 are in the second rank of logic because input pins 106-4 and 106-6 are coupled to primary inputs 102-3 and 102-4, while input pins 106-3 and 106-5 are coupled to output pin 108-1, which is the output pin of gate 104-1, in the first rank of logic, which is also the last completed rank of logic.

A rank of logic for a backwards traversal of the circuit starts with primary outputs 110. Each gate 104 for which all output pins 108 are directly coupled to primary outputs 110 comprises the first rank of logic. In FIG. 1, primary outputs 110-1 and 110-2 couple directly to output pins 108-2 and 108-3, therefore gates 104-2 and 104-3 are in the first rank of logic. Gate 104-1 has output pin 108-1 that is not directly coupled to primary output 110, so gate 104-1 is not in the first rank of logic. All gates 104 in chip 100 are accounted for, so the first rank of logic is complete and gates 104-2 and 104-3 are in the first rank of logic. The next rank of logic is comprised of gates 104 whose output pin 108 is coupled to primary output 110 or to input pins 106 of a gate in the previous or last completed rank of logic. In FIG. 1, gate 104-1 is in the second rank of logic because output pin 108-1 is coupled to input pins 106-3 and 106-5, which are input pins 106 of gates 104-2 and 104-3, in the first rank of logic, which is also the last completed rank of logic. The above steps are well know in the art and is equally applied to a circuit having any number of gates. Conductors or wires 612 have wire delays associated with the distance between gates, among other factors. Wire delay is inherent and specific to each wire.

Figure 2:
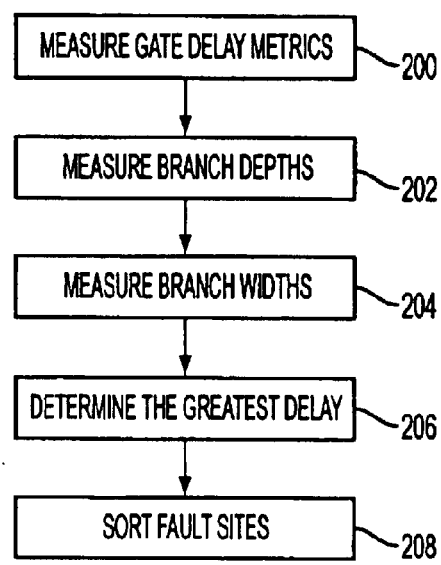
FIG. 2 is a flow chart of one embodiment to select the least slack path, according to the present invention.

FIG. 2 is a flow chart of one embodiment of the present invention to select a least slack path, or slowest path through a circuit. Step 200 measures or accumulates the gate delay metrics and assigns a delay metric value to each input pin 106 for both a forward and backward traversal of the circuit. The delay metric value assigned to each pin is a calculation of the amount of time a signal takes to propagate to the pin or point of interest in the circuit when the signal travels over the slowest route. In one embodiment, this method assigns a single number to every pin on every gate in the netlist for the worst delay backward toward the controllable inputs, as well as a single number for the worst delay to propagate forward to the observable destination. Gate delay metrics guide pattern generation to cover a longest path through a fault site, as well as enable the evaluation of fortuitous fault coverage of non-target faults.

Step 202 measures branch depth along a path and assigns to each input pin 106 branch depth values for both a forward and backward circuit traversal at that location in the path. Branch depth tracks the number of times that a path has an output that leads to more than one input. In other words, branch depth provides a method of counting the number of times fanout is greater than one on a path. Step 204 measures branch width along a path and assigns to each input pin 106 branch width values for both a forward and backward traversal of the circuit at that location in the path. Branch width provides a method of counting the total number of fanout branches that are driven on a path. Step 206 determines the least slack or greatest delay path from the measured gate delay metrics. Step 208 sorts a list of fault sites based on the gate delay metric, branch width value, and branch depth value assigned to each input pin.

Figure 3:
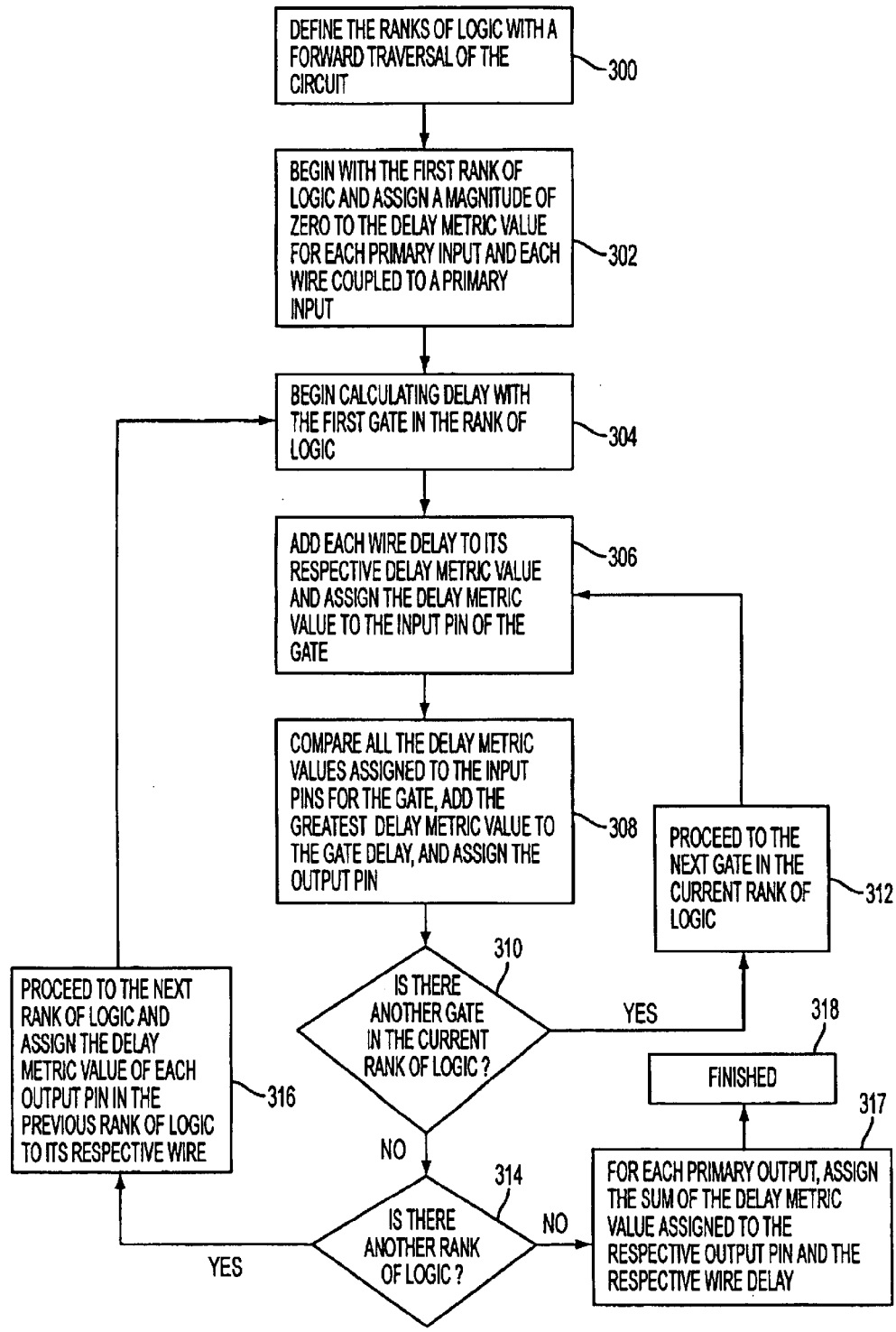
FIG. 3 is a flow chart showing a part of step 200 of FIG. 2 and measurement of the delay metric value in a forward traversal of a circuit, according to the present invention.
Figure 4A:
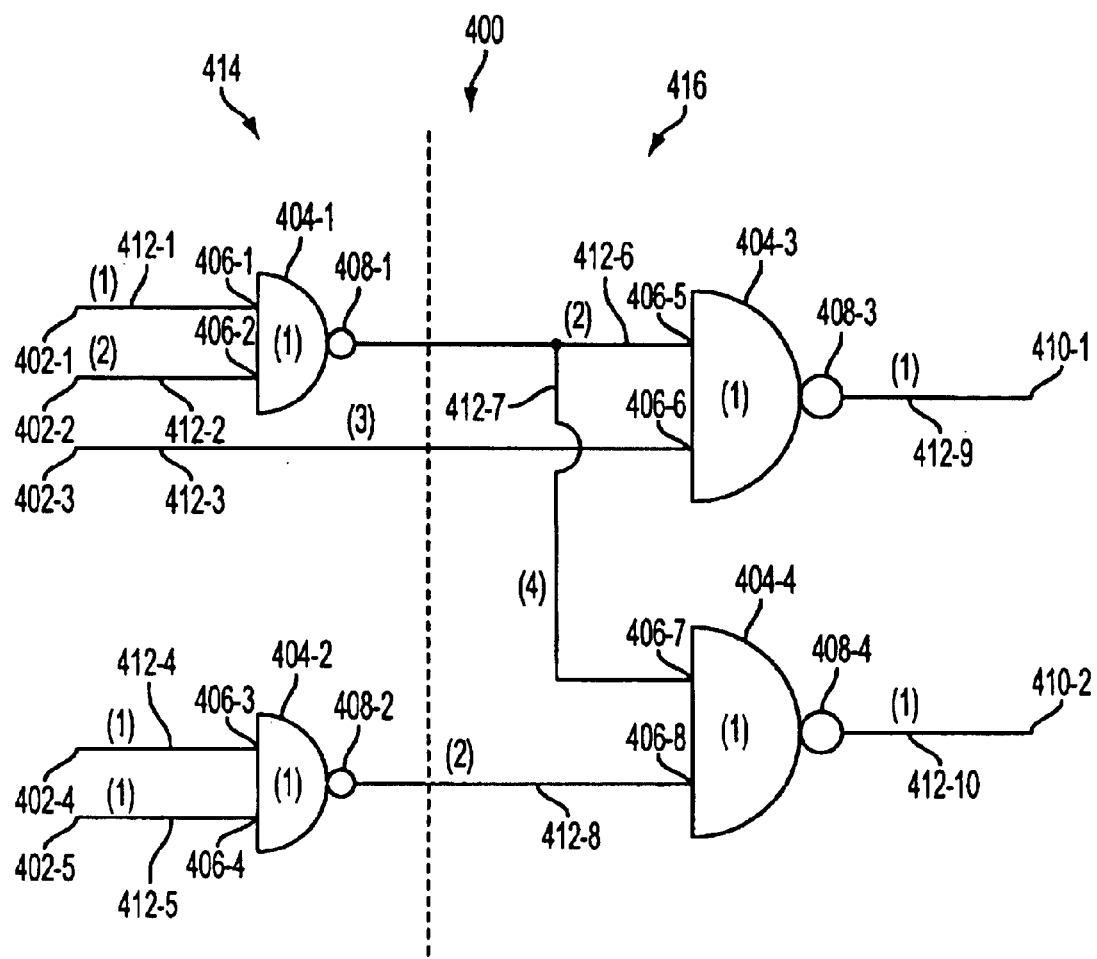
FIG. 4a is an exemplary circuit demonstrating the steps shown in FIG. 3.

FIG. 3 is a flow chart showing a part of step 200 of FIG. 2 and measures the delay metric value in a forward traversal of the circuit. The steps of FIG. 3 are demonstrated with exemplary circuit 400 of FIG. 4a to show forward delay metric value calculations. The intermediate forward delay metric values, as assigned by the steps in FIG. 3, are shown by a chart in FIG. 4b. In FIG. 4b, columns represent primary inputs 402, wires 412, input pins 406, output pins 408, and primary outputs 410. Rows represent steps in the delay accumulation and calculation for the forward traversal. Although all the components of circuit 400 are depicted as NAND gates, the present invention is also applicable to circuits with other configurations, and/or components, including without limitation, other NOR gates, OR gates, and AND gates. Circuit 400 has wire delays designated in parentheses near the associated wires 412 and gate delay values designated in parentheses within the associated gates. In this example, each gate has a gate delay value of one. In general, however, gate delay values may be any value, and may be maintained in a reference file. For example, a reference file such as an SDF file may be utilized to designate the delay values for the gates and wires, as shown above with reference to FIG. 1.

In FIG. 3 at step 300, the ranks of logic are defined with a forward traversal of the circuit 400. As described above, gates 404-1 and 404-2 have primary inputs 402-1, 402-2, 402-4, 402-5 and are in first rank 414. Gates 404-3 and 404-4 are in second rank 416. Step 302 begins with the first rank of logic and assigns a magnitude of zero to the forward delay metric values for each primary input. In first rank 414, wire 412-1 is coupled to primary input 402-1, wire 412-2 is coupled to primary input 402-2, wire 412-3 is coupled to primary input 402-3, wire 412-4 is coupled to primary input 402-4, and wire 412-5 is coupled to primary input 402-5. Step 304 begins to calculate the forward delay metric value with a first gate in the rank of logic. The "first gate" is arbitrarily chosen, and in this example, gate 404-1 is chosen as the first gate of the first rank 414.

Step 306, assigns each wire delay coupled with a primary input to the input pin of the gate in the first rank. FIG. 3a shows that wire 412-1 has a wire delay of one and the input pin 402-1 has a forward delay metric value of zero from step 302. Therefore, input pin 406-1 is assigned a forward delay metric value of one. Wire 412-2 has a wire delay of two, and the input pin 402-2 has a forward delay metric value of zero from step 302. Therefore, input pin 406-2 is assigned a forward delay metric value of two. Step 308 compares all the forward delay metric values assigned to each input pin for the gate and adds the greatest forward delay metric value to the gate delay and assigns it to the output pin. Gate 404-1 has a gate delay value of one, input pin 406-1 has a forward delay metric value of one, while input pin 406-2 has a forward delay metric value of two. Therefore, the gate delay value of gate 404-1 (one) is added to the forward delay metric value of input pin 406-2 (two), and a resulting forward delay metric value of three is assigned to output pin 408-1.

Step 310 determines whether all the gates in the current rank of logic have been determined and assigned to the output pin. In the present example, FIG. 4a forward delay metric values have not been assigned to gate 404-2. Thus, step 312 proceeds to the next gate in the current rank of logic, and the process returns to step 306. The next gate is gate 404-2. Step 306 adds each wire delay to its respective forward delay metric value and assigns the forward delay metric value to the input pin of the gate. FIG. 4a shows that wire 412-4 has a wire delay of one and a forward delay metric value of zero for input pin 402-4 from step 302. Therefore, input pin 406-3 is assigned a forward delay metric value of one. Wire 412-5 has a wire delay of one and a forward delay metric value of zero for input pin 402-5 from step 302. Therefore, input pin 406-4 is assigned a forward delay metric value of one. FIG. 4b shows the forward delay metric values assigned to input pins 406-1 through 406-4 during the iterative step of 306. With respect to step 308, input pins 406-3 and -4 have forward delay metric values of one. Therefore, the gate delay value of gate 404-2 (one) is added to the forward delay metric value of either input pin since they are the same (one) and a forward delay metric value of two is assigned to output pin 408-2. FIG. 4b shows that output pins 408-1 and 408-2 are respectively assigned forward delay metric values of three and two.

If step 310 determines that there are no further gates in the rank logic, step 314 is entered and the process determines whether there is another rank of logic. In the present examples, the forward delay metric value for second rank 416 has not been accumulated, so step 316 proceeds to the next rank of logic and assigns the forward delay metric value of each output pin to its respective wire. Output pin 408-1 has a forward delay metric value of three, and is coupled to wires 412-6 and 412-7, so the forward delay metric value of three is added to the wire delay of each wire 412-6 and 412-7. Output pin 408-2 is coupled to wire 412-8 and has a forward delay metric value of two, so the output pin forward delay metric value of two is added to the wire delay of wire 412-8. FIG. 4b reflects the values assigned during step 316.

Step 304 begins with gate 404-3 in the second rank of logic 416. Step 306 adds each output pin forward delay metric value with the wire delay and assigns the resulting forward delay metric value to the input pin of the gate 404-3. FIG. 4a shows that wire 412-6 has a wire delay of two and is coupled to input pin 406-5, so adding the output pin forward delay metric value from step 316 gives input pin 406-5 a forward delay metric value of five. Input pin 406-6 receives a forward delay metric value of three because it is coupled to wire 412-3. Wire 412-3 has a wire delay of three and a forward delay metric value of zero from primary input 402-3, from step 302. FIG. 4b shows the forward delay metric values assigned to input pins 406-5 and -6 in step 306. Step 308 assigns output pin 408-3 a forward delay metric value of six after taking the larger of the forward delay metric values assigned to input pins 406-5 (five) and 406-6 (three) and adding it to the gate delay value (one). Step 310 determines that there is another gate in the current rank of logic, and step 312 proceeds to the next gate.

Step 306 proceeds to gate 404-4. Step 306 adds the wire delay of wire 412-7 (four according to FIG. 4a), which is coupled to input pin 406-7, to the output pin 408-1 forward delay metric value (three according to FIG. 4b) producing seven, which is assigned to input pin 406-7. Step 306 also adds the wire delay of wire 412-8 (two according to FIG. 4a), which is coupled to input pin 406-8, to the output pin 408-2 forward delay metric value (two according to FIG. 4b) producing four, which is assigned to input pin 406-7 (step 306). Step 308 compares the forward delay metric values assigned to input pins 406-7 and 406-8, adds the greater of the two forward delay metric values (seven, for input pin 406-7) to the gate delay value of gate 404-4 (one according to FIG. 4a), and assigns the sum (eight) to output pin 408-4.

Step 310 determines that there are no more gates in the current rank of logic and step 314 determines that there are no more ranks of logic. Accordingly, step 317 assigns the sum of the forward delay metric value assigned to the respective output pin and the respective wire delay for each primary output. Output pin 408-3 is coupled to primary output 410-1 through wire 412-9, and output pin 408-4 is coupled to primary output 410-2 through wire 412-10. Primary output 410-1 is assigned a forward delay metric value of six (forward delay metric value of output pin 408-3 according to FIG. 4b) plus one (wire delay of wire 412-9 according to FIG. 4a), or seven. Primary output 410-2 is assigned a forward delay metric value of eight (forward delay metric value of output pin 408-4 according to FIG. 4b) plus one (wire delay of wire 412-10 according to FIG. 4a), or nine. At step 318, the steps to calculate the forward delay metric value in a forward direction are finished.

Figure 5:
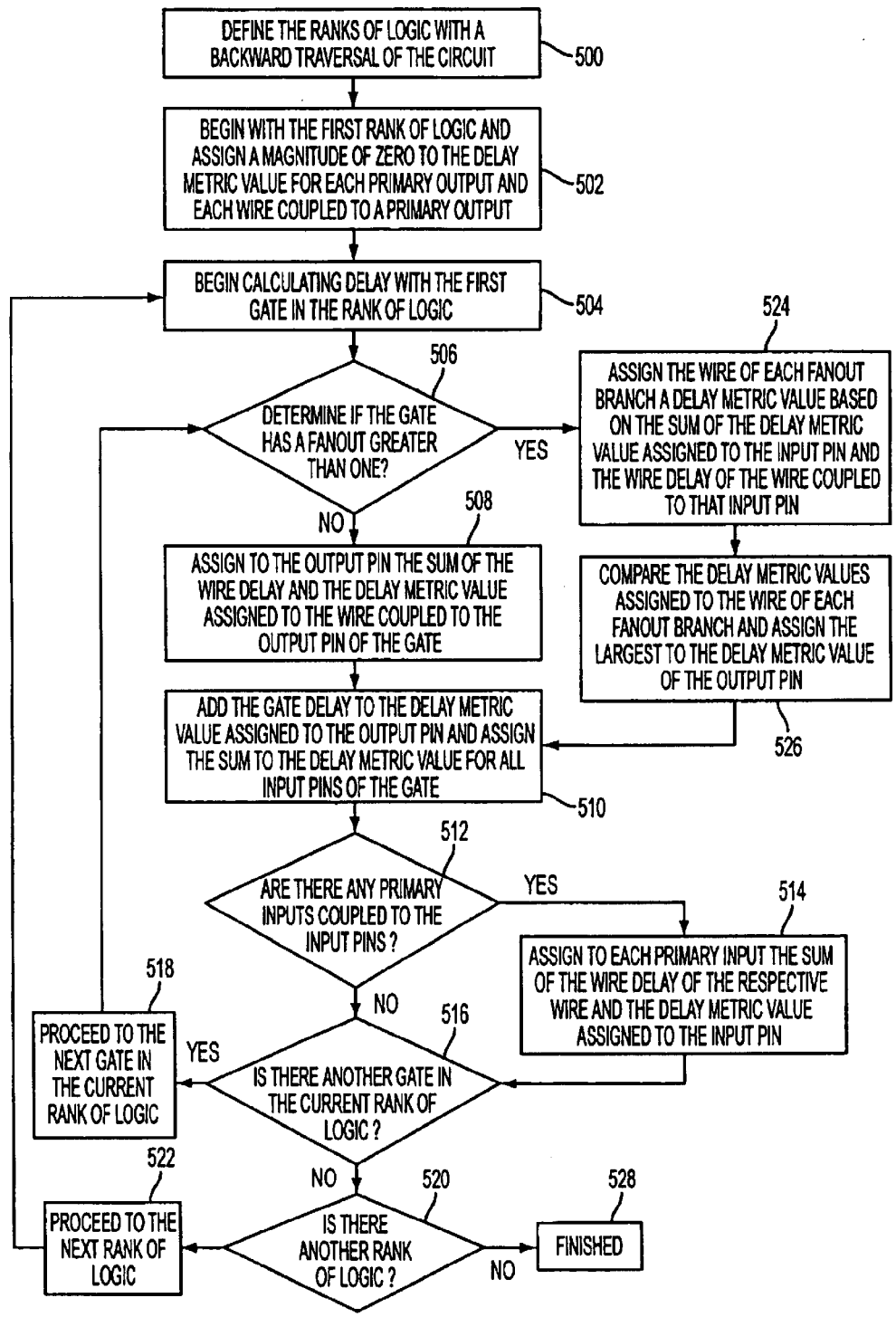
FIG. 5 is a flow chart showing a part of step 200 of FIG. 2 and measurement of the delay metric value in a backward traversal of a circuit, according to the present invention.
Figure 6A:
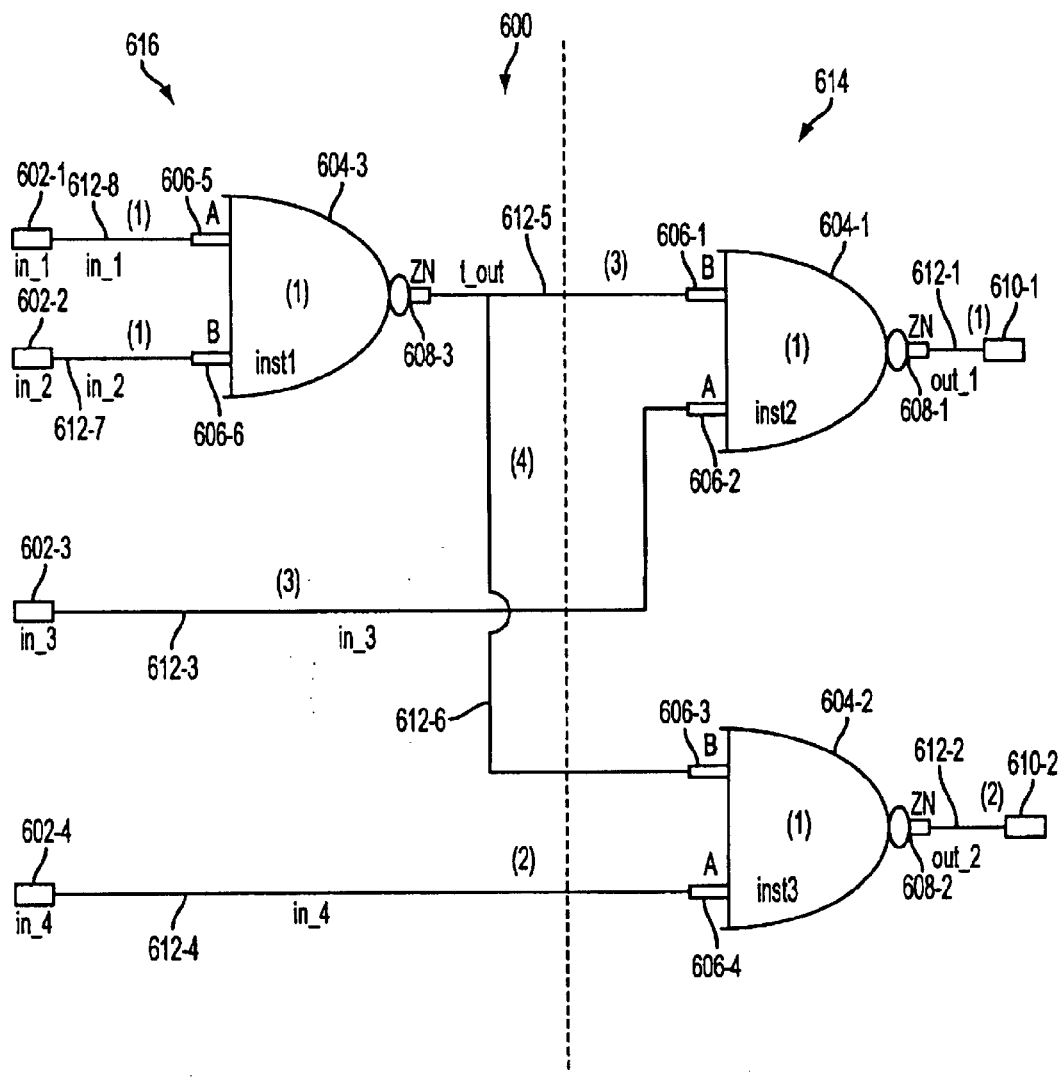
FIG. 6a is an exemplary circuit used to demonstrate the steps in FIG. 5.

FIG. 5 is a flow chart showing a part of step 200 of FIG. 2 and measures the delay metric value in a backward traversal of the circuit. The steps of FIG. 5 are demonstrated with exemplary circuit 600 of FIG. 6a to show backward delay metric value calculations. The intermediate backward delay metric values, as assigned by the steps in FIG. 5, are shown by a chart in FIG. 6b. In FIG. 6b, columns represent primary outputs 610, wires 612, input pins 606, output pins 608, and primary inputs 602. Rows represent different steps in the delay accumulation and calculation for the backward traversal. Although all the components of circuit 600 are depicted as NAND gates, the present invention is also applicable to circuits with other configurations, and/or components, including without limitation, other NOR gates, OR gates, and AND gates. Circuit 600 has wire delays in parentheses near the associated wire and gate delay metrics in parentheses within the gate. In this example, each gate has a gate delay value of one. In general, however, gate delay values may be any value, and may be maintained in a reference file. For example, a reference file such as an SDF file may be utilized to designate the delay values for the gates and wires, as shown above with reference to FIG. 1.

Step 500 defines the ranks of logic with a backward traversal of the circuit. Following the above-described procedure to define ranks of logic, gates 604-1 and 604-2 are in first rank 614, and gate 604-3 is in second rank 616. Calculations start with primary outputs 610 and progress to primary inputs 602. Therefore, ranks of logic 614 and 616 are reversed compared to the example in FIG. 4*a*.

Step 502 begins with the first rank of logic and assigns a magnitude of zero to the backward delay metric value for each primary output. In first rank 614, wire 612-1 is coupled to primary output 610-1, and wire 612-2 is coupled to primary output 610-2. Step 504 begins to accumulate the backward delay metric value with the first gate in the rank of logic. The "first gate" may be arbitrarily chosen, and in this example, gate 604-1 is the first gate in first rank 614. Step 506 determines whether the gate has a fanout greater than one. Gate 604-1 has output pin 608-1 coupled to primary output 610-1 and therefore has a fanout equal to one. Step 508 assigns to the output pin the sum of the wire delay and the backward delay metric value assigned to the wire coupled to the output pin of the gate, as described in step 502. FIG. 6*a* shows that wire 612-1 is coupled to output pin 608-1 and wire 612-1 has a wire delay of one. Thus, adding that delay of one to the backward delay metric value assigned to wire 612-1 (zero according to step 502, see FIG. 6*b*) yields a backward delay metric value of one, which is assigned to output pin 608-1.

Step 510 adds the gate delay value to the backward delay metric value assigned to the output pin and assigns the sum to the backward delay metric value for all input pins of the gate. The gate delay value for gate 604-1 is one, which is added to the backward delay metric value assigned to output pin 608-1 (one) and the sum (two) is assigned to input pins 606-1 and -2 (see FIG. 6*b*, step 510).

Step 512 determines whether there are any primary inputs coupled to the gate input pins. In circuit 600, primary input 602-3 is coupled with input pin 606-2 through wire 612-3. Thus, step 514 assigns to each primary input the sum of the wire delay of the respective wire (612-3), and the backward delay metric value assigned to the input pin. Primary input 602-3 is coupled to input pin 606-2 with wire 612-3. The sum of the wire delay for wire 612-3 (three according to FIG. 6*a*) and the backward delay metric value assigned to input pin 606-2 (two according to FIG. 6*b*), totals five, which is assigned to the backward delay metric value for primary input 602-3. Step 516 determines whether there is another gate in the current rank of logic. Backward delay metric values for gate 604-2 have not yet been calculated, and step 518 proceeds to the next gate in the current rank of logic. At step 506, since output pin 608-2 is coupled to primary output 610-2, the fanout of gate 604-2 is not greater than one.

Step 508 assigns the sum of the wire delay for wire 612-2 (two according to FIG. 6*a*) and the backward delay metric value assigned to wire 612-2 (zero according to FIG. 6*b*), which yields two. Step 510 adds the gate delay value for gate 604-2 (one according to FIG. 6*a*) to the backward delay metric value assigned to output pin 608-2 (two), and assigns the sum (three) to input pins 606-3 and -4. For step 510, FIG. 6*b* shows a backward delay metric value of three assigned to input pins 606-3 and -4, as well as a backward delay metric value of two assigned to input pins 606-1 and -2. Step 512 determines that primary input 602-4 is coupled to input pin 606-4 through wire 612-4, and step 514 assigns to primary input 602-4 the sum of the wire delay (2 according to FIG. 6*a*) and the backward delay metric value assigned to input pin 606-4 (three according to FIG. 6*b*), yielding five. Step 516 determines that there is not another gate in the current rank of logic, and step 520 determines whether there is another rank of logic. Backward delay metric values for second rank 616 have not yet been calculated, so step 522 proceeds to the next rank of logic.

Second rank 616 has only one gate, which is gate 604-3, and step 504 begins to calculate backward delay metric values for gate 604-3. Step 506 determines that output pin 608-3 is coupled to input pins 606-1 and -3 and therefore has a fanout greater than one. Step 524 assigns the wire of each fanout branch a backward delay metric value based on the sum of the backward delay metric value assigned to the input pin, and the wire delay of the wire coupled to that input pin. Wires 612-5 and -6 are the fanout branches from output pin 608-3. Wire 612-5 is assigned a backward delay metric value of the sum of the wire delay (three according to FIG. 6*a*) and the backward delay metric value assigned to input pin 606-1 (two according to FIG. 6*b*), yielding five. Wire 612-6 is assigned a backward delay metric value of the sum of the wire delay (four according to FIG. 6*a*) and the backward delay metric value assigned to input pin 606-3 (three according to FIG. 6*b*), yielding seven.

One aspect of the present invention is that it advantageously tracks delays that may differ over the various paths of the fanout branch. This aspect can grow in importance as circuits shrink in size, and the interconnect delays become larger than the gate delays. This aspect is illustrated in the above example with wires 612-5 and -6.

Step 526 compares the backward delay metric values assigned to the wire of each fanout branch and assigns the largest to the backward delay metric value of the output pin. Backward delay metric values of five and seven were assigned to wires 612-5 and 612-6, respectively. Therefore, a backward delay metric value of seven is assigned to output pin 608-3. Step 510 adds the gate delay value (one according to FIG. 6*a*) to the backward delay metric value assigned to output pin 608-3 (seven according to FIG. 6*b*). This addition results in a backward delay metric value of eight, which is assigned to input pins 606-5 and 606-6 of gate 604-3. Step 512 tests whether primary inputs are coupled to the input pins. Primary inputs 602-1 and 602-2 are coupled to input pins 606-5 and 606-6 through wires 612-8 and 612-7, respectively. Step 514 assigns primary input 602-1 the sum of the wire delay for wire 612-8 (one according to FIG. 6*a*) and the backward delay metric value assigned to input pin 606-5 (eight according to FIG. 6*b*), which yields nine. Input pin 602-2 is assigned the sum of the wire delay for wire 612-7 (one according to FIG. 6*a*) and the backward delay metric value assigned to input pin 606-6 (eight according to FIG. 6*b*), which yields nine. Step 516 determines there are no more gates in the current rank of logic, and step 520 determines there are no more ranks of logic. At step 528, the steps to calculate the delay metric value in a backward direction are finished.

Figure 7:
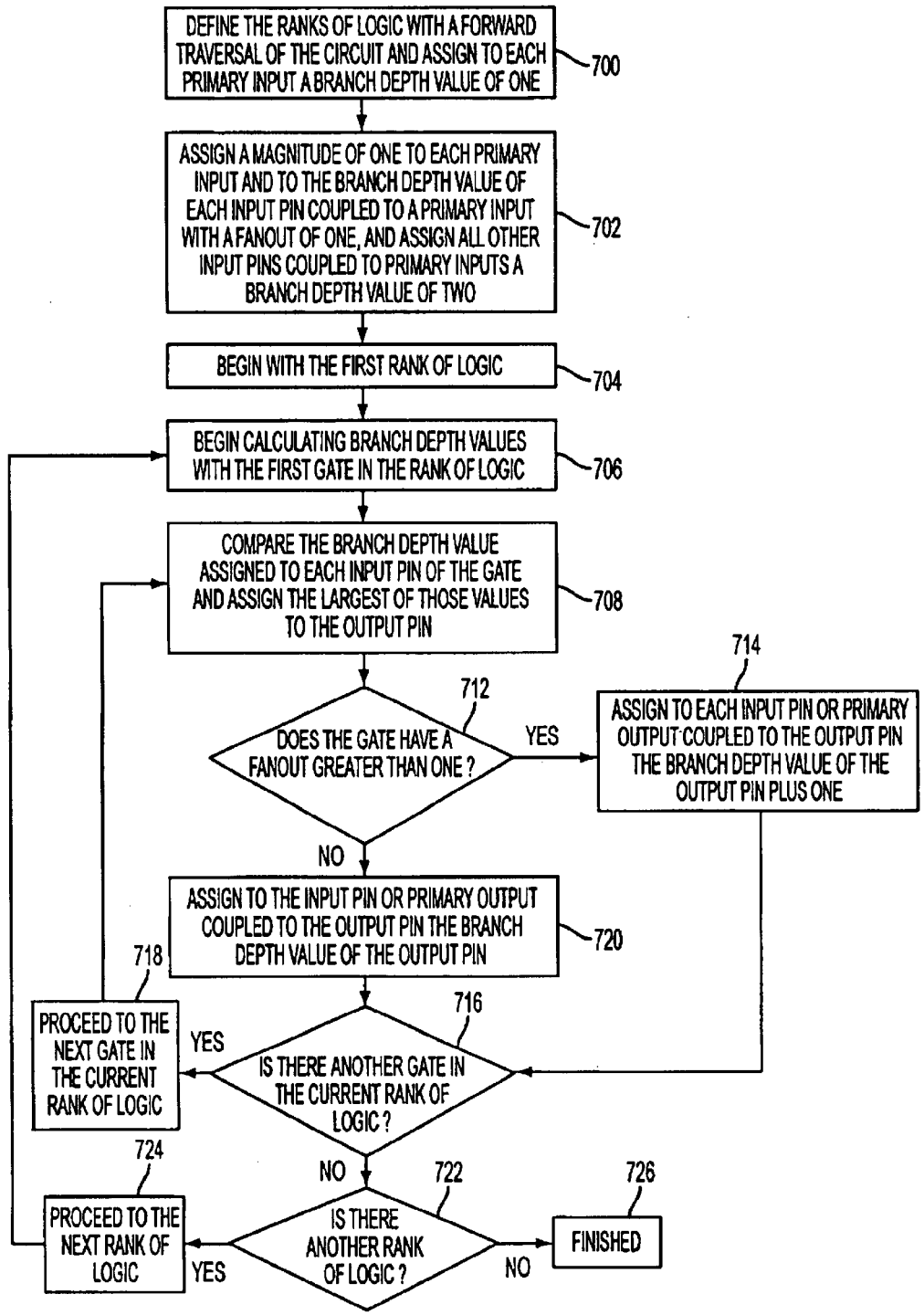
FIG. 7 is a flow chart showing a part of step 202 of FIG. 2 and measurement of the branch depth value in a forward traversal of a circuit, according to the present invention.
Figure 8A:
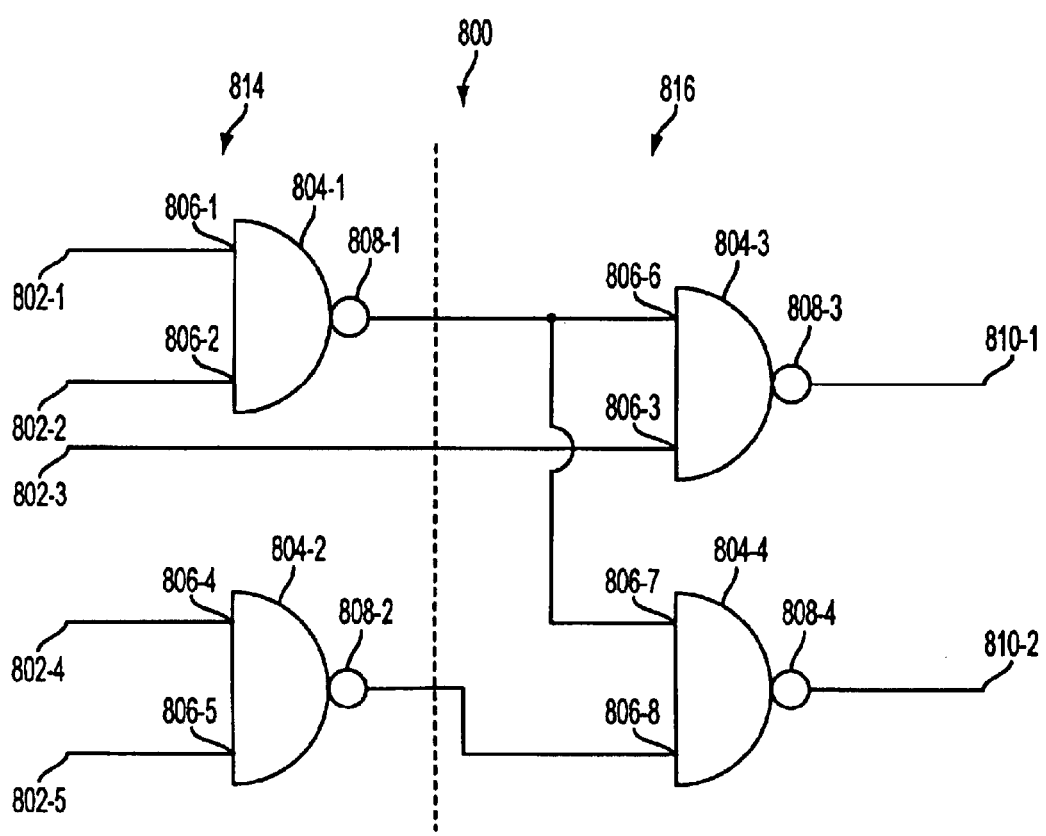
FIG. 8a is an exemplary circuit used to demonstrate the steps in FIG. 7.

FIG. 7 is a flow chart showing a part of step 202 of FIG. 2 and measures the branch depth value in a forward traversal of the circuit. The steps of FIG. 7 are demonstrated with exemplary circuit 800 of FIG. 8a to show forward branch depth calculations. The intermediate forward branch depth values, as assigned by the steps in FIG. 7, are shown by a chart in FIG. 8b. In FIG. 8b, columns represent forward branch depth values assigned to primary inputs 802, input pins 806, output pins 808, and primary outputs 810. Rows represent different steps in forward branch depth calculation. Although all the components of circuit 800 are depicted as NAND gates, the present invention is also applicable to circuits with other configurations, and/or components, including without limitation, other NOR gates, OR gates, and AND gates. Circuit 800 has wire delays in parentheses near the associated wire and gate delay metrics in parentheses within the gate. In this example, each gate has a gate delay metric of one. In general, however, gate delay metrics may be any value, and may be maintained in a reference file. For example, a reference file such as an SDF file may be utilized to designate the delay values for the gates and wires, as shown above with reference to FIG. 1.

Step 700 defines the ranks of logic with a forward traversal of the circuit. According to the above-described method of defining ranks of logic, gates 804-1 and -2 are in first rank 814, and gates 804-3 and -4 are in second rank 816. Step 702 assigns a magnitude of one to the forward branch depth value of each primary input and to each input pin coupled to a primary input with a fanout of one, and assigns all other input pins coupled to primary inputs a forward branch depth value of two. Primary inputs 802-1 through 802-5 each have fanouts of one and are coupled to input pins 806-1 through 806-5, respectively. Therefore, a one is assigned to the forward branch depth values for input pins 806-1 through 806-5. Step 704 begins with the first rank of logic, which is rank 814. Step 706 begins to calculate forward branch depth values with a first gate in the rank of logic. In this example, the "first gate" is arbitrarily chosen as gate 804-1, although any gate in the first rank may be chosen as the first gate.

Step 708 compares the forward branch depth value assigned to each input pin of the gate, and assigns the largest of those values to the output pin. Gate 804-1 has input pins 806-1 and -2, which are both assigned a forward branch depth value of one. Neither is larger, and a one is assigned to the forward branch depth value of output pin 808-1. Step 712 determines whether the gate has a fanout greater than one. Output pin 808-1 is coupled to two input pins, input pins 806-6 and 806-7, and therefore has a fanout greater than one. As noted, an aspect of the present invention is that it advantageously tracks delays that may differ over the various paths of the fanout branch. The present invention provides a method that can calculate delays that differ over different paths in a fanout branch, and can also calculate delays that do not differ over the different paths of a fanout branch.

Step 714 assigns to each input pin or primary output coupled to the output pin the forward branch depth value of the output pin plus one. Output pin 808-1 is coupled to input pins 806-6 and -7, therefore input pins 806-6 and -7 are each assigned a forward branch depth value of two. Step 716 determines whether there is another gate in the current rank of logic. Forward branch depth for gate 804-2, which is in first rank 814, has not been determined, and step 718 then proceeds to the next gate in the current rank of logic.

A comparison is made of the forward branch depth values of input pins 806-4 and -5 (one according to FIG. 8b), and a one is assigned to output pin 808-2. Step 712 determines whether gate 804-2 has a fanout greater than one. Gate 804-2 does not have a fanout greater than one because output pin 808-2 is coupled to only input pin 806-8. Step 720 assigns to the input pin coupled to the output pin the forward branch depth value of the output pin. Input pin 806-8 is coupled to output pin 808-2, which is assigned a forward branch depth value of one according to FIG. 8b. Therefore, input pin 806-8 receives a forward branch depth value of one.

There are no more gates in first rank 814, and step 722 determines whether there is another rank of logic. Forward branch depth for second rank 816 has not been determined, and step 724 proceeds to the next rank of logic. Step 706 begins to calculate forward branch depth values with gate 804-3 as the designated "first gate" in the rank of logic. Step 708 compares the forward branch depth values assigned to input pin 806-6 (two according to FIG. 8b) with the value assigned to input pin 806-3 (one according to FIG. 8b), and assigns the larger forward branch depth value (two) to output pin 808-3.

Step 712 determines that gate 804-3 does not have a fanout greater than one, and step 720 assigns to primary output 810-1 the forward branch depth value of output pin 808-3, or two. Step 716 determines that there are no more ranks of logic, and that the forward branch depth value for gate 804-4 still needs to be calculated. Step 718 then proceeds to the next gate in second rank 816. Step 708 compares the forward branch depth values assigned to input pin 806-7 (two according to FIG. 8b) with input pin 806-8 (one according to FIG. 8b), and assigns the larger forward branch depth value (two) to output pin 808-4. Per step 712, gate 804-4 does not have a fanout greater than one. Step 720 assigns to primary output 810-2 the forward branch depth value of output pin 808-4, or two. Because step 716 determines there are no more gates in the current rank of logic, and step 722 determines there are no more ranks of logic, the branch depth calculation for circuit 800 in a forward traversal of the circuit is finished (step 726).

Figure 9:
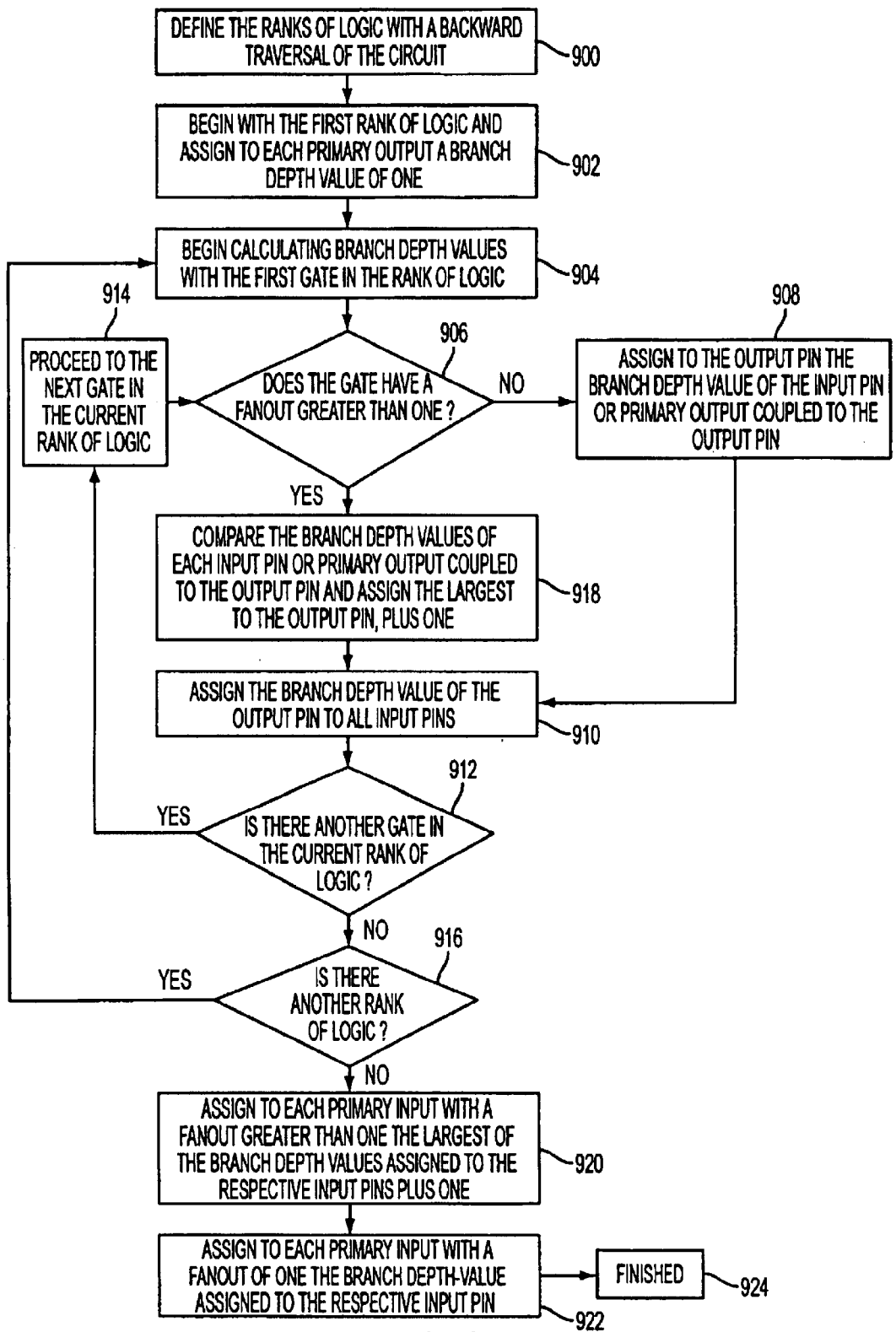
FIG. 9 is a flow chart showing a part of step 202 of FIG. 2 and measurement of the branch depth value in a backward traversal of a circuit, according to the present invention.
Figure 10A:
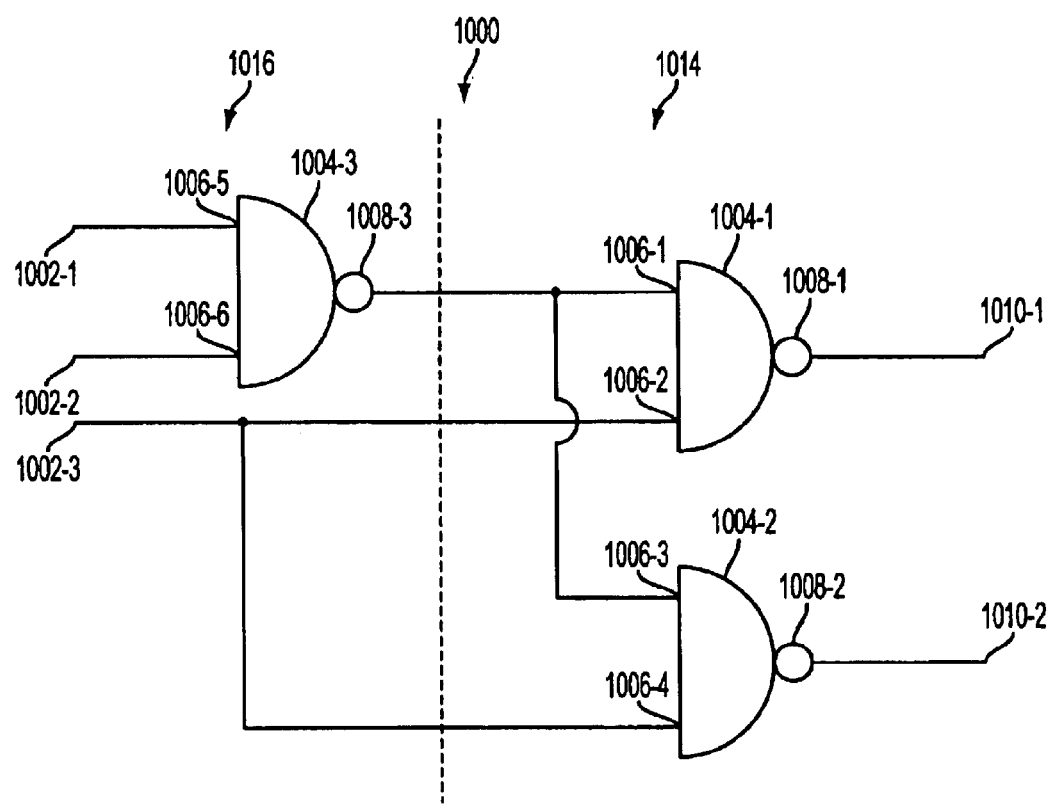
FIG. 10a is an exemplary circuit used to demonstrate the steps in FIG. 9.

FIG. 9 is a flow chart showing a part of step 202 of FIG. 2 and measures the branch depth value in a backward traversal of the circuit. The steps of FIG. 9 are demonstrated with exemplary circuit 1000 of FIG. 10a to show backward branch depth calculations. The intermediate backward branch depth values, as assigned by the steps in FIG. 9, are shown by a chart in FIG. 10b. In FIG. 10b, columns represent backward branch depth values assigned to primary outputs 1010, input pins 1006, output pins 1008, and primary inputs 1002. Rows represent steps in backward branch depth calculation. Although all the components of circuit 1000 are depicted as NAND gates, the present invention is also applicable to circuits with other configurations, and/or components, including without limitation, other NOR gates, OR gates, and AND gates. Circuit 1000 has wire delays in parentheses near the associated wire and gate delay metrics in parentheses within the gate. In this example, each gate has a gate delay metric of one. In general, however, gate delay metrics may be any value, and may be maintained in a reference file. For example, a reference file such as an SDF file may be utilized to designate the delay values for the gates and wires, as shown above with reference to FIG. 1. Step 900 defines the ranks of logic with a backward traversal of the circuit. According to the above method of defining ranks of logic, gates 1004-1 and 1004-2 are in first rank 1014, and gate 1004-3 is in second rank 1016. Calculations begin with primary outputs 1010 and progress to primary inputs 1002. Therefore, ranks of logic 1014 and 1016 are reversed as compared to the example in FIG. 8a.

Step 902 begins with the first rank of logic and assigns to each primary output a backward branch depth value of one. Primary outputs 1010-1 and -2 are each assigned a backward branch depth value of one, shown in FIG. 10b under step 902. Step 904 begins to calculate backward branch depth values with a first gate in the rank of logic. Gate 1004-1 is arbitrarily chosen as the first gate in the rank of logic. Step 906 determines whether the gate has a fanout greater than one. Output pin 1008-1 is coupled only to primary output 1010-1, so the fanout of gate 1004-1 is one. Step 908 assigns to the output pin the backward branch depth value of the input pin or primary output coupled to the output pin. Output pin 1008-1 is coupled with primary output 1010-1, and primary output 1010-1 has a backward branch depth value of one, so a backward branch depth value of one is assigned to output pin 1008-1. Step 910 assigns the backward branch depth value of the output pin to all input pins of the gate. Gate 1004-1 has input pins 1006-1 and 1006-2, and a backward branch depth value of one is assigned to each input pin. Step 912 determines whether there is another gate in the current rank of logic that has not been processed to assign backward branch depth values to the pins. Backward branch depth for gate 1004-2 in first rank 1014 has not yet been calculated, and step 914 proceeds to the next gate in the current rank of logic, namely to gate 1004-2.

Step 906 determines whether the output pin of the gate has a fanout greater than one. Output pin 1008-2 is coupled only to primary output 1010-2, so the gate fanout is one. Step 908 assigns output pin 1008-2 a backward branch depth value of primary output 1010-2, which is one. Step 910 assigns the gate input pins 1006-3 and -4 the backward branch depth value of output pin 1008-2, which is one. Since there are no more gates in first rank 1014 (step 912), step 916 determines whether there is another rank of logic. Because the backward branch depth value for second rank 1016 has not been calculated, the process returns to step 904 and begins to calculate the backward branch depth values through gate 1004-3.

Since step 906 determines that gate 1004-3 has a fanout greater than one, step 918 compares the backward branch depth values of each input pin or primary output coupled to the output pin of interest, assigns the largest backward branch depth value to the output pin, and adds one to the largest value. Input pins 1006-1 and -3 are coupled to output pin 1008-3, and each input pin has a backward branch depth value of one, so a two (one plus one) is assigned to the backward branch depth value of output pin 1008-3. Step 910 assigns input pins 1006-5 and -6 the backward branch depth value of output pin 1008-3, which is one according to FIG. 10b (step 910). Because there are no more gates in the current rank of logic (step 912), and there are no more ranks of logic (step 916), step 920 assigns to each primary input with a fanout greater than one the largest of the backward branch depth values assigned to the respective input pins plus one. Primary input 1002-3 has a fanout greater than one, so the backward branch depth value of input pin 1006-2 (one according to FIG. 10b) is compared with the backward branch depth value of input pin 1006-4 (one according to FIG. 10b), and a backward branch depth value of two (one plus one) is assigned to primary input 1002-3.

Step 922 assigns to each primary input with a fanout of one the backward branch depth value assigned to the respective input pin. Primary inputs 1002-1 and -2 are coupled to input pins 1006-5 and -6, respectively. Therefore, primary inputs 1002-1 and -2 have a fanout of one. Primary inputs 1002-1 and -2 are each assigned a backward branch depth value of two, the same backward branch depth value assigned to input pins 1006-5 and -6, respectively. The branch depth calculation for circuit 1000 in a backward traversal of the circuit is finished (step 924).

Figure 11:
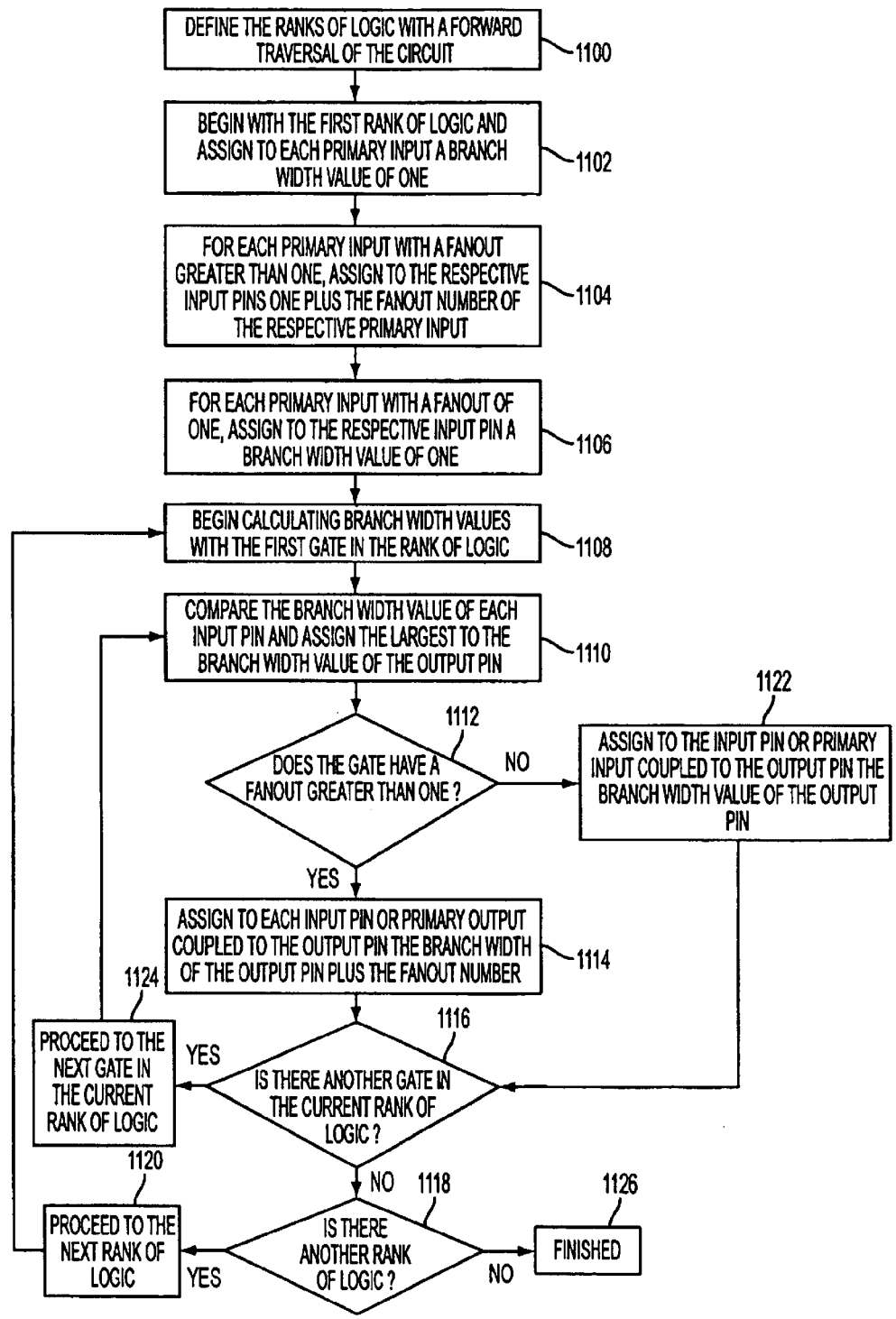
FIG. 11 is a flow chart showing a part of step 204 of FIG. 2 and measurement of the branch width value in a forward traversal of a circuit, according to the present invention.
Figure 12A:
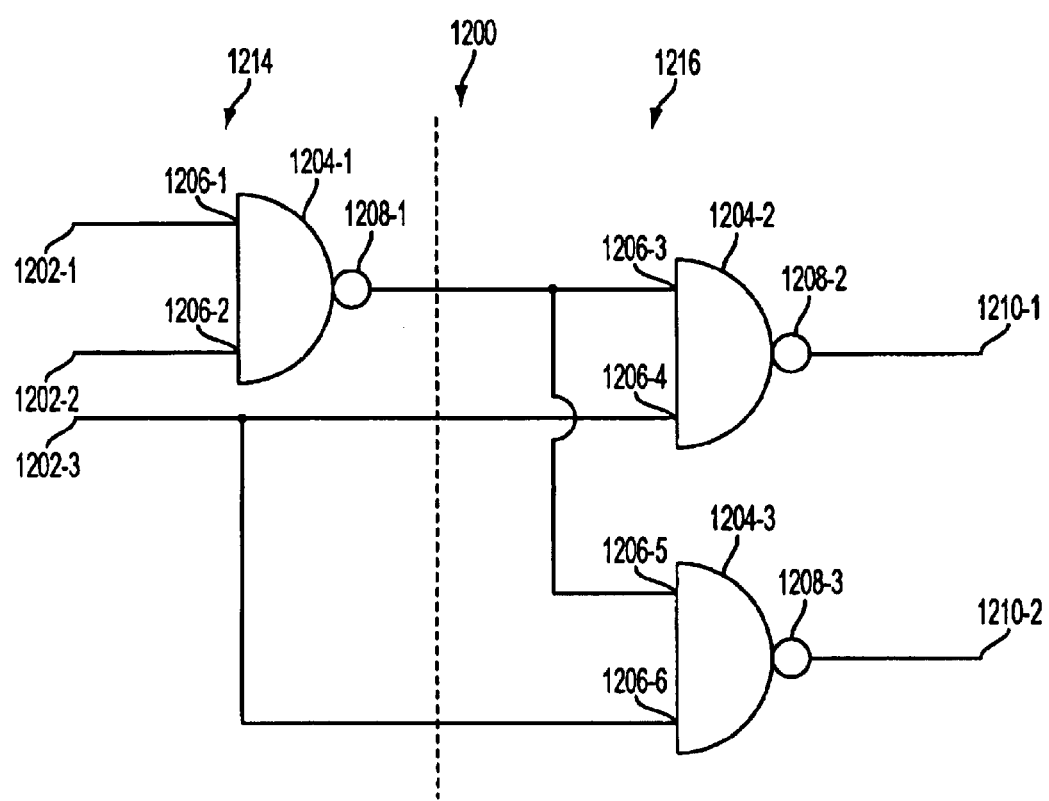
FIG. 12a is an exemplary circuit used to demonstrate the steps in FIG. 11.

FIG. 11 is a flow chart showing a part of step 204 in FIG. 2 and measures forward branch width in a forward traversal of the circuit. The steps of FIG. 11 are demonstrated with exemplary circuit 1200 of FIG. 12a to show forward branch width calculations. The intermediate forward branch width values, as assigned by the steps in FIG. 11, are shown by a chart in FIG. 12b. Columns represent forward branch width values assigned to primary inputs 1202, input pins 1206, output pins 1208, and primary outputs 1210. Rows represent different steps in forward branch width calculation. Although all the components of circuit 1200 are depicted as NAND gates, the present invention is also applicable to circuits with other configurations, and/or components, including without limitation, other NOR gates, OR gates, and AND gates. Circuit 1200 has wire delays in parentheses near the associated wire and gate delay metrics in parentheses within the gate. In this example, each gate has a gate delay metric of one. In general, however, gate delay metrics may be any value, and may be maintained in a reference file. For example, a reference file such as an SDF file may be utilized to designate the delay values for the gates and wires, as shown above with reference to FIG. 1.

Step 1100 defines the ranks of logic with a forward traversal of the circuit. According to the above-described method of defining ranks of logic, gate 1204-1 is in first rank 1214, and gates 1204-2 and -3 are in second rank 1216. Step 1102 begins with the first rank of logic and assigns to each primary input a forward branch width value of one. Primary inputs 1202-1 through 1202-3 are each assigned a forward branch width value of one, as shown in FIG. 12b under step 1102. In step 1104, for each primary input with a fanout greater than one, the respective input pins are assigned one plus the fanout number of the respective primary input. Primary input 1202-3 is coupled to input pins 1206-4 and 1206-6 and therefore has a fanout of two. Primary inputs 1206-4 and 1206-6 are assigned a forward branch width value of one (forward branch width value for primary input 1202-3) plus two (fanout number for primary input 1202-3), resulting in a forward branch width value of three.

In step 1106, for each primary input with a fanout of one, the respective input pin is assigned a forward branch width value of one. Primary inputs 1202-1 and -2 are coupled to input pins 1206-1 and -2, respectively, and input pins 1206-1 and -2 are each assigned a forward branch width value of one. Step 1108 begins to calculate forward branch width values for the gates in the current rank of logic. Gate 1204-1 is the only gate in first rank 1214. Step 1110 compares the forward branch width value of each input pin and assigns the largest to the forward branch width value of the output pin. Input pins 1206-1 and -2 both have forward branch width values of one, so a forward branch width value of one is assigned to output pin 1208-1. Step 1112 determines whether the gate has a fanout greater than one. Output pin 1208-1 is coupled to two input pins, so gate 1204-1 has a fanout of two.

Step 1114 assigns to each input pin or primary output coupled with the output pin the forward branch width value of the output pin plus the fanout number. Input pins 1206-3 and 1206-5 are each assigned a forward branch width value of one (forward branch width value of output pin 1208-1) plus two (fanout of output pin 1208-1), resulting in a forward branch width value of three. Step 1116 determines whether there is another gate in the current rank of logic. Referring to FIG. 12, there are no more gates in first rank 1214, so step 1118 determines whether there is another rank of logic. Forward branch width values for second rank 1216 are not calculated, so step 1120 proceeds to the next rank of logic. Step 1108 begins to calculate forward branch width values for gate 1204-2, which is arbitrarily chosen, in second rank 1216.

Step 1110 compares the forward branch width values of input pins 1206-3 and -4 and assigns a forward branch width value of three to output pin 1208-2 because neither input pin has a forward branch width value larger than the other. Because in step 1112 the fanout of gate 1204-2 is not greater than one, step 1122 assigns to the input pin or primary input coupled to the output pin the forward branch width value of the output pin. Primary output 1210-1 is coupled to output pin 1208-2, so the forward branch width value of output pin 1208-2 (three according to FIG. 12b) is assigned to primary output 1210-1. Because step 1116 determines there is another gate in the current rank of logic, step 1124 proceeds to the next gate in the current rank of logic, which is gate 1204-3.

Step 1110 compares the forward branch width values assigned to input pins 1206-5 and -6, and assigns a forward branch width value of three to output pin 1208-3. Because gate 1204-3 has a fanout of one (step 1112), primary output 1210-2 is assigned the forward width value of output pin 1208-3 (three according to FIG. 12b). Because step 1116 determines there are no more gates in the current rank of logic and step 1118 determines there are no more ranks of logic, the forward branch width calculation for circuit 1200 in a forward traversal of the circuit is finished (step 1126).

Figure 13:
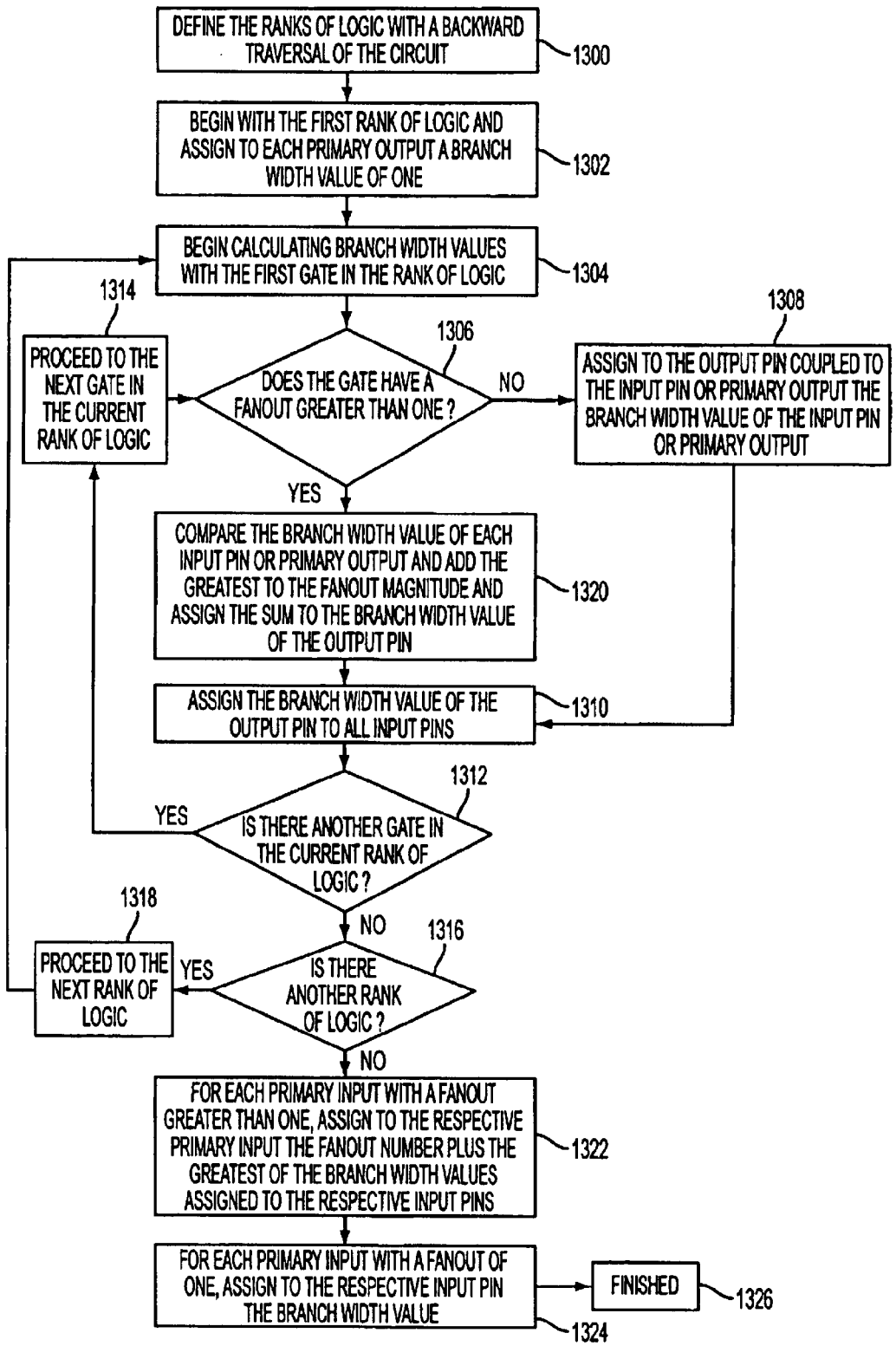
FIG. 13 is a flow chart showing a part of step 204 of FIG. 2 and measurement of the branch width value in a backward traversal of a circuit, according to the present invention.

FIG. 13 is a flow chart showing a part of step 204 in FIG. 2 and measures the branch width in a backward traversal of the circuit. The steps of FIG. 13 are demonstrated with exemplary circuit 1400 of FIG. 14a to show backward branch width calculation. The intermediate backward branch width values, as assigned by the steps in FIG. 13, are shown by a chart in FIG. 14b. Columns represent backward branch width values assigned to primary outputs 1410, input pins 1406, output pins 1408, and primary inputs 1402. Rows represent different steps in backward branch width calculation. Although all the components of circuit 1400 are depicted as NAND gates, the present invention is also applicable to circuits with other configurations, and/or components, including without limitation, other NOR gates, OR gates, and AND gates. Circuit 1400 has wire delays in parentheses near the associated wire and gate delay metrics in parentheses within the gate. In this example, each gate has a gate delay metric of one. In general, however, gate delay metrics may be any value, and may be maintained in a reference file. For example, a reference file such as an SDF file may be utilized to designate the delay values for the gates and wires, as shown above with reference to FIG. 1.

Step 1300 defines the ranks of logic with a backward traversal of the circuit. According to the above-described method of defining ranks of logic, gates 1404-1 and 1404-2 are in first rank 1414, and gate 1404-3 is in second rank 1416. Calculations are made by starting with primary outputs 1410 and progressing backward to primary inputs 1402. Therefore, ranks of logic 1414 and 1416 are reversed as compared to the example in FIG. 12a.

Step 1302 begins with the first rank of logic and assigns to each primary output a backward branch width value of one. Each primary output 1410-1 and -2 receives a backward branch width value of one, as indicated in FIG. 14b. Step 1304 begins to calculate backward branch width values with a gate in the rank of logic. Gate 1404-1 is arbitrarily chosen as the first gate in first rank 1414. Step 1306 determines whether the gate has a fanout greater than one. Output pin 1408-1 is coupled only to primary output 1410-1, so gate 1404-1 has a fanout of one. Step 1308 assigns to the output pin coupled to an input pin or primary output the backward branch width value of the input pin or primary output. Output pin 1408-1 is assigned the backward branch width value of primary output 1410-1 (one according to FIG. 14b). Step 1310 assigns the backward branch width value of the output pin to all input pins. Input pins 1406-1 and -2 are assigned the backward branch width value of output pin 1408-1 (one according to FIG. 14b). Step 1312 determines whether there is another gate in the current rank of logic. Backward branch width values for gate 1404-2 have not been calculated, so step 1314 proceeds to the next gate in the current rank of logic. Gate 1404-2 is the next gate in first rank 1414.

Step 1306 determines that gate 1404-2 has a fanout of one because output pin 1408-2 is coupled only to primary output 1410-2. Output pin 1408-2 is assigned the backward branch width value of primary output 1410-2 (one according to FIG. 14b). Step 1310 assigns input pins 1406-3 and -4 the backward branch width value of output pin 1408-2 (one according to FIG. 14b). Because step 1312 determines there are no more gates in the current rank of logic, step 1316 determines whether there is another rank of logic. Backward branch width values for second rank 1416 have not been calculated, so step 1318 proceeds to the next rank of logic.

Step 1304 begins to calculate backward branch width values with gate 1404-3. Output pin 1408-3 is coupled to input pins 1406-1 and -3 such that gate 1404-3 has a fanout of two. Step 1306 determines that gate 1404-3 has a fanout greater than one. Therefore, step 1320 compares the backward branch width value of each input pin or primary output, adds the greatest to the fanout magnitude, and assigns the sum to the backward branch width value of the output pin. Input pins 1406-1 and -3 each have backward branch width values of one, so the fanout (two according to FIG. 14a) is added to the greatest backward branch width value (one according to FIG. 14b), and a backward branch width value of three is assigned to output pin 1408-3.

Figure 14A:
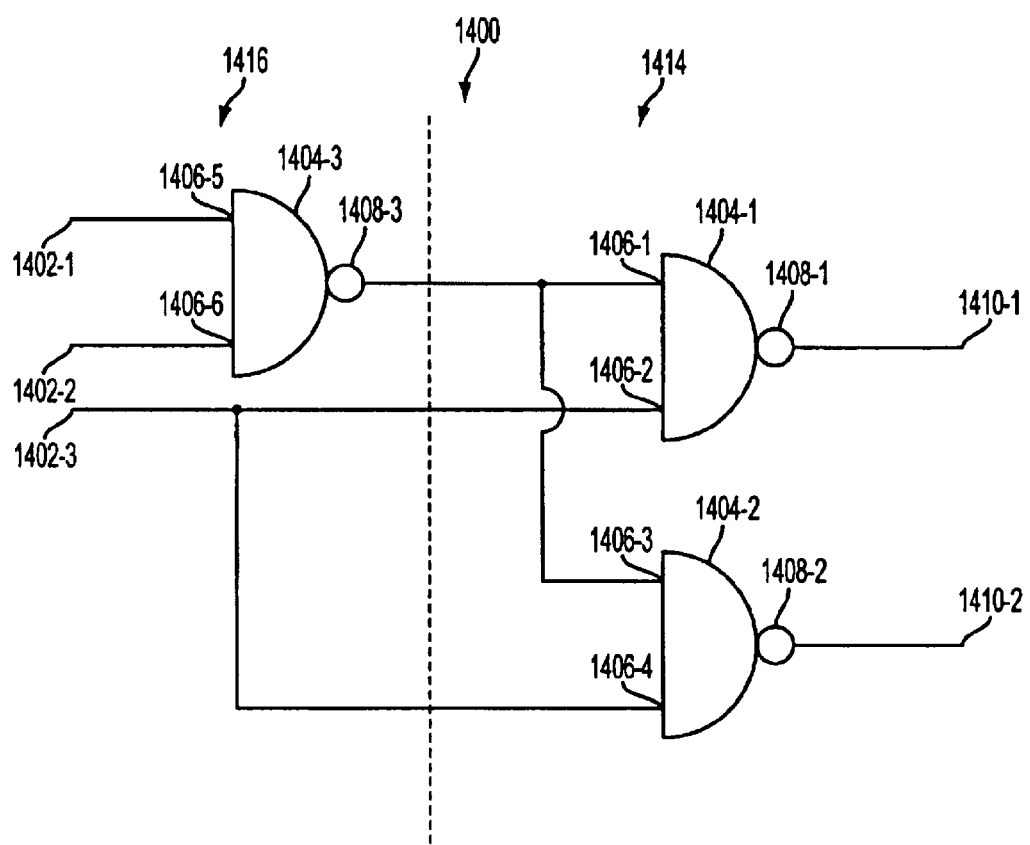
FIG. 14a is an exemplary circuit used to demonstrate the steps in FIG. 13.

Step 1310 assigns input pins 1406-5 and -6 the backward branch width value of output pin 1408-4 (three according to FIG. 14b). Step 1312 determines there are no more gates in second rank 1416, and step 1316 determines there are no more ranks of logic. For each primary input with a fanout greater than one, step 1322 assigns the respective primary input the fanout number plus the greatest of the backward branch width values assigned to the respective input pins. Primary input 1402-3 is coupled to input pins 1406-2 and -4, and therefore has a fanout of two. Primary input 1402-3 is assigned the greatest of the backward branch width values of input pins 1406-2 and -4 (one according to FIG. 14b) plus the fanout number (two according to FIG. 14a), resulting in a value of three.

For each primary input with a fanout of one, step 1324 assigns to the primary input the backward branch width value of the respective input pin. Primary input 1402-1 is coupled only to input pin 1406-5, so the backward branch width value of input pin 1406-5 (three according to FIG. 14b) is assigned to primary input 1402-1. Primary input 1402-2 is coupled only to input pin 1406-6, so the backward branch width value of input pin 1406-6 (three according to FIG. 14b) is assigned to primary input 1402-2. The branch width calculations of circuit 1400 in a backward direction is finished (step 1326).

Figure 15:
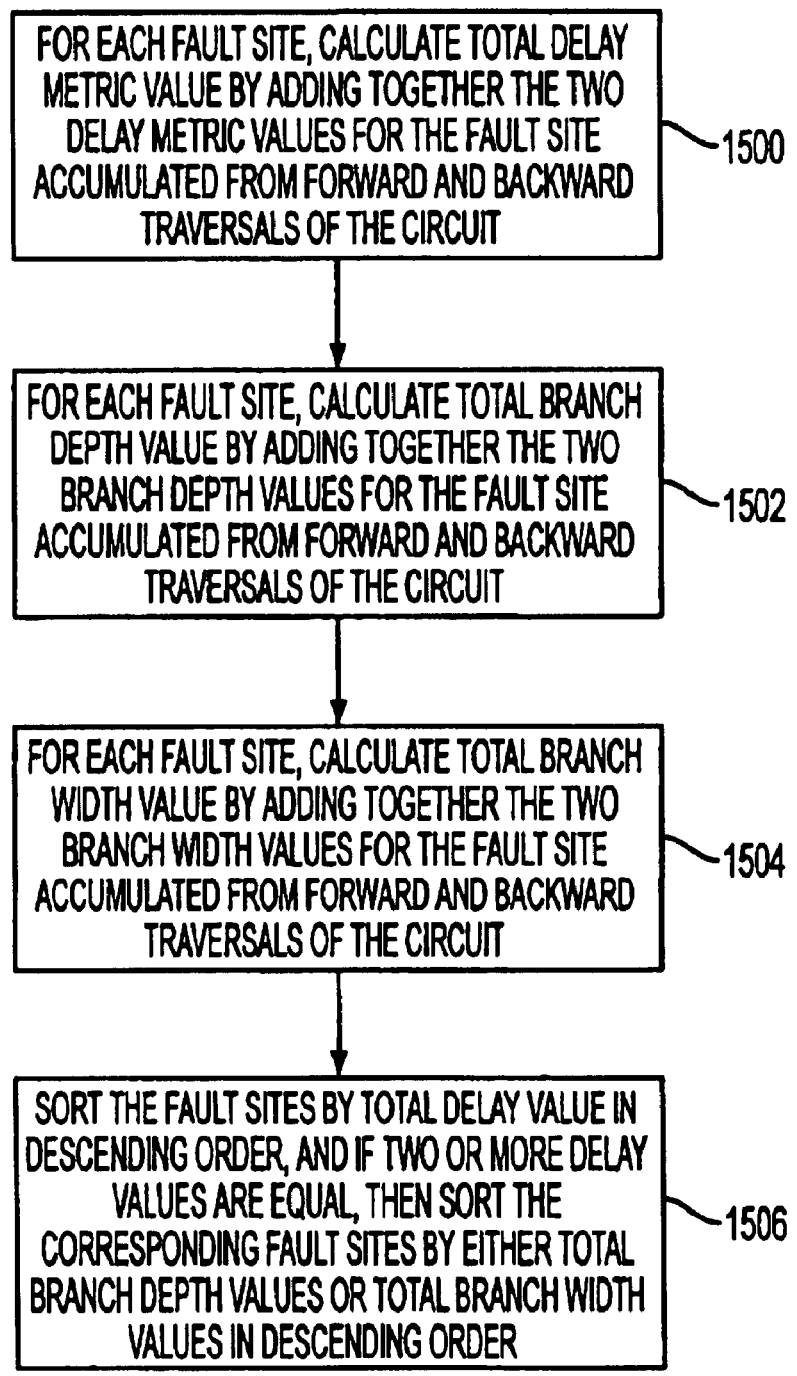
FIG. 15 is a flow chart showing steps for sorting fault sites, according to the present invention.

FIG. 15 is a flow chart of an expanded version of step 208 in FIG. 2. FIG. 15 shows the steps for sorting a list of fault sites. The fault sites comprise primary inputs and outputs, as well as gate input and output pins on the gates. For each fault site, step 1500 calculates a total delay metric value by adding together the accumulated delay metric values of both forward and backward traversals of the circuit for the fault site. These two delay metric values were previously calculated in the steps of FIGS. 3 and 5 for each fault site. The delay metric value from a forward traversal of the circuit is calculated according to the steps in FIG. 3. The delay metric value from a backward traversal of the circuit is calculated according to the steps in FIG. 5. Adding together these two delay metric values produces a total delay metric value for each fault site. This delay metric value represents the longest delay through the circuit at that pin in the circuit.

For each fault site, step 1502 calculates a total branch depth value by adding together the assigned forward and backward branch depth values for the fault site. These two branch depth values were previously calculated in the steps of FIGS. 7 and 9 for each fault site. The branch depth value from a forward traversal of the circuit is calculated according to the steps in FIG. 7. The branch depth value from a backward traversal of the circuit is calculated according to the steps in FIG. 9. Adding together these two branch depth values produces the total branch depth value for each fault site.

For each fault site, step 1504 calculates a total branch width value by adding together the assigned forward and backward branch width values for the fault site. These two branch width values were previously calculated in the steps of FIGS. 11 and 13 for each fault site. The branch width value from a forward traversal of the circuit is calculated according to the steps in FIG. 11. The branch width value from a backward traversal of the circuit is calculated according to the steps in FIG. 13. Adding together these two branch width values produces the total branch width value for each fault site.

Step 1506 sorts the fault sites by total delay metric value in descending order. If the delay metric values of two or more fault sites are equal, then step 1506 sorts these fault sites according to either total width or total depth values in descending order. According to the present invention, it is irrelevant whether the total width values or the total depth values are used as the next sorting factor.

Figure 16:
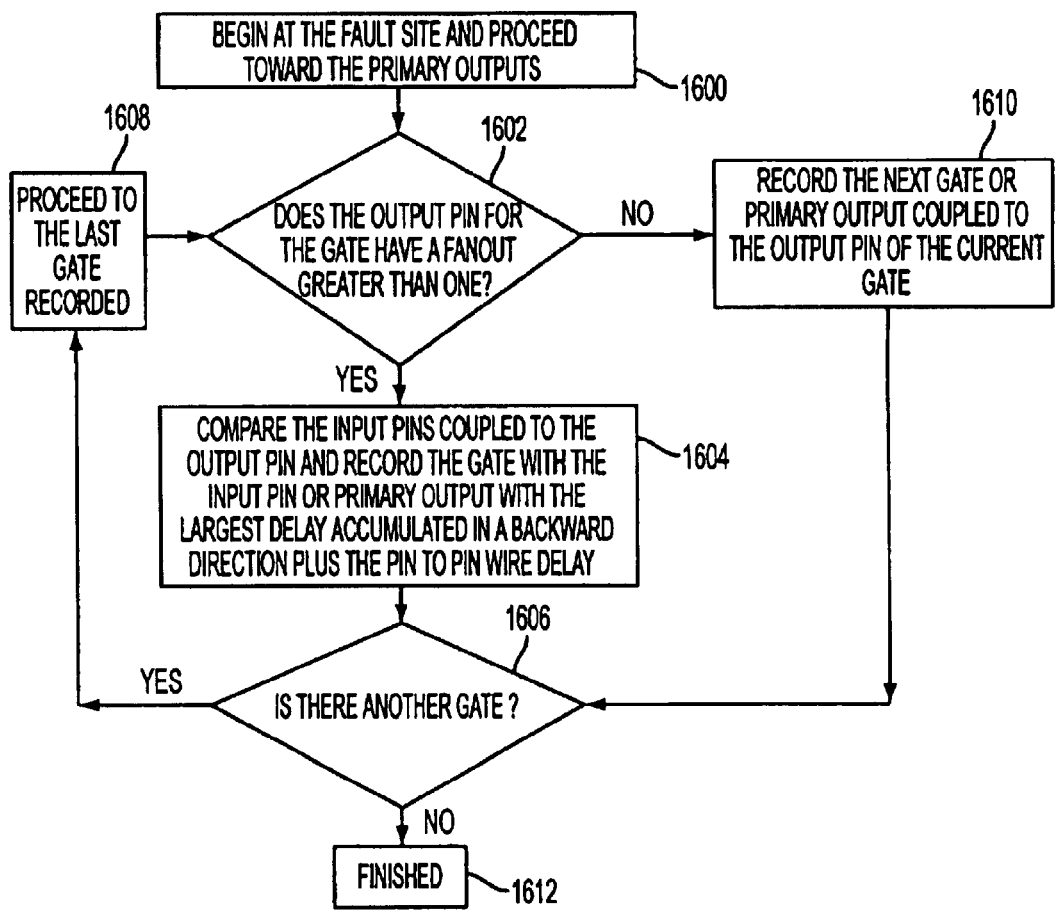
FIG. 16 is a flow chart partially showing steps to determine the least slack path of FIG. 2 from a fault site to a primary output, according to the present invention.
Figures 17, 18B:
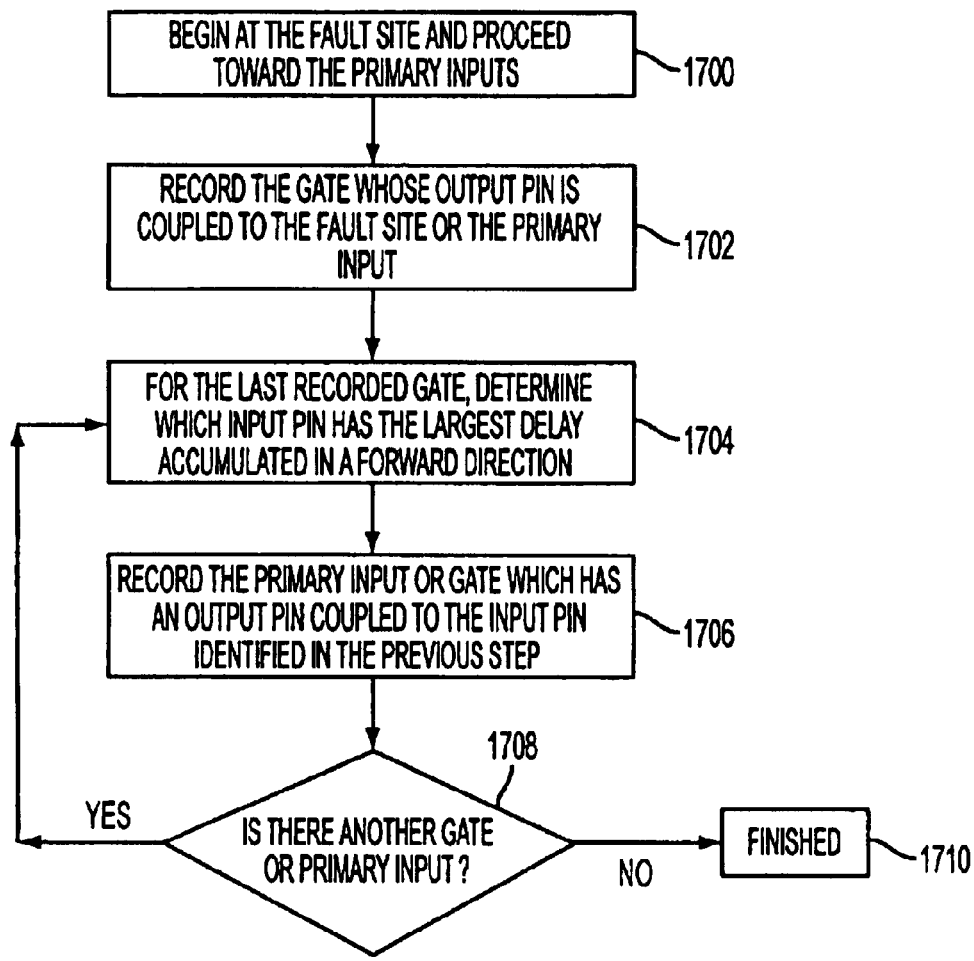
FIG. 17 is a flow chart partially showing the steps to determine the least slack path of FIG. 2 from a fault site to a primary input, according to the present invention.
FIG. 18b is a list of gates along the least slack path determined by the steps of FIGS. 16 and 17, according to the present invention.
Figure 18A:
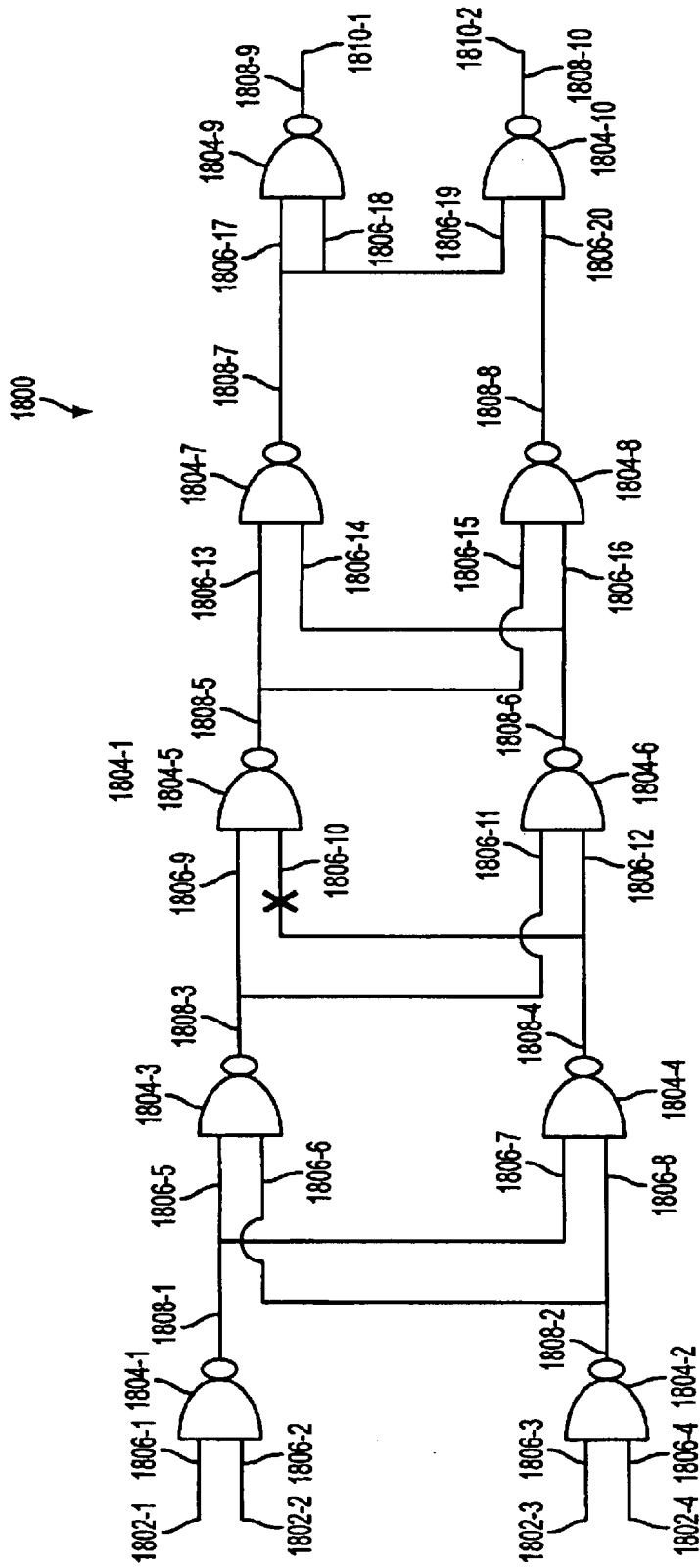
FIG. 18a is an exemplary circuit used to demonstrate the steps of FIGS. 16 and 17.

FIG. 16 is a flow chart of a part of step 206 in FIG. 2, showing the steps for determining the least slack (longest or greatest delay) path from a fault site to a primary output. FIG. 17 is also a flow chart of a part of step 206 in FIG. 2, and shows the steps for determining the least slack path from a fault site to a primary input. FIGS. 16 and 17, in conjunction with FIG. 18a, show how the longest delay path through a fault site is determined. As previously discussed, a fault site in this context is an input pin on a gate and will typically exist between primary inputs and primary outputs. Fault sites can also be primary inputs, primary outputs and all pins on a gate. FIG. 18a is an exemplary circuit 1800 consisting of a plurality of NAND gates 1804. In this example, input pin 1806-10, designated with an "X", is selected as the fault site for demonstrating the steps in FIGS. 16 and 17. FIG. 18b is a list of gates recorded along the least slack path determined by the steps of FIGS. 16 and 17.

In FIG. 16, step 1600 begins at the fault site and proceeds toward the primary outputs. The fault site in this example is input pin 1806-10 of gate 1804-5 in FIG. 18a. Step 1602 determines whether the output pin for the gate has a fanout greater than one. Output pin 1808-5 is coupled to input pins 1806-13 and -15, and therefore has a fanout greater than one. Step 1604 compares the input pins coupled to the output pin and records the gate with the input pin or primary output having the largest delay accumulated in a backward direction plus the pin to pin wire delay. Because input pin 1806-15 has a larger sum of backward accumulated delay metric plus pin to pin wire delay than input pin-13, gate 1804-8 is recorded as the next gate. Step 1606 determines whether another gate follows the gate recorded in step 1604. Because gate 1804-10 is the next gate coupled with the gate recorded, which is gate 1804-8, step 1608 proceeds to the last gate recorded, which is gate 1804-8.

Step 1602 again determines whether the output pin for the gate has a fanout greater than one. Output pin 1808-8 does not have a fanout greater than one because it is coupled to only one input pin, which is input pin 1806-20. At step 1610, the next gate or primary output coupled to the output pin of the current gate is recorded. Gate 1804-10 is recorded because it is coupled to output pin 1808-8 through input pin 1806-20. Because step 1606 determines there are no more gates after gate 1804-10, the method of determining the least slack path from a fault site to a primary output is finished (step 1612). The least slack path determined in this example is from input pin 1806-10 to primary output 1810-2 proceeding through gates 1804-5, -8 and -10.

FIG. 17 is a flow chart of a part of step 206 in FIG. 2, that shows the steps for determining the least slack path from a fault site to a primary input. FIG. 17 is used in conjunction with FIG. 18a to show how the longest delay path through a fault site is determined. As in the previous example for FIG. 16, input pin 1806-10 is the fault site. In FIG. 17, step 1700 begins at the fault site and proceeds toward the primary inputs. The fault site is input pin 1806-10 of gate 1804-5. Step 1702 records the gate whose output pin is coupled to the fault site. Because input pin 1806-10 is coupled to gate 1804-4 through output pin 1808-4, gate 1804-4 is recorded in step 1702. Step 1704 determines which input pin has the largest delay accumulated in a forward direction for the last recorded gate. Between input pins 1806-7 and -8, input pin 1806-7 has the largest delay. Step 1706 records the primary input or gate which has an output pin coupled to the input pin of the gate previously identified and recorded in the previous step. Output pin 1808-1 of gate 1804-1 is coupled to input pin 1806-7, so gate 1804-1 is recorded. Step 1708 determines whether there is another gate or primary input. Primary inputs 1802-1 and -2 are coupled to gate 1804-1.

Step 1704 determines which input pin has the largest delay accumulated in a forward direction for the last recorded gate, which is gate 1804-1. In this example input pin 1806-1 has a larger delay than input pin 1806-2. Step 1706 records the primary input 1802-1 because it is coupled to input pin 1806-1. Because step 1708 determines there are no more gates or primary inputs, the steps for determining the least slack path from a fault site to a primary input are finished (step 1710).

In summary, the least slack path through the fault site at input pin 1806-10 of circuit 1800 begins at primary input 1802-1, proceeds to gate 1804-1, then to gate 1804-4, then to gate 1804-5 (the gate of the fault site), then to gate 1804-8, then to gate 1804-10, and then to primary output 1810-2. The progression is shown in FIG. 18b along with the steps in which each gate or primary input was assigned. The steps of FIG. 2 are complete with respect to determining the longest path through the circuit associated with the designated fault site.

Figure 19:
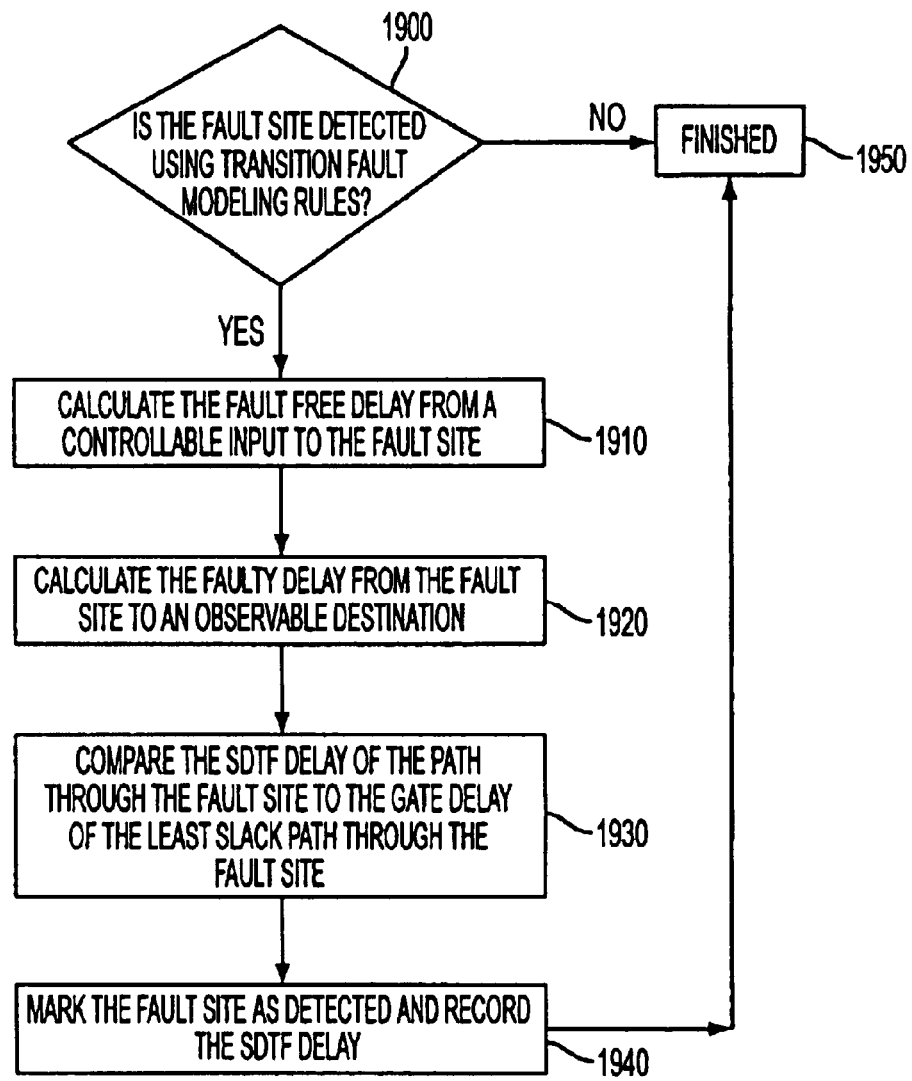
FIG. 19 is a flow chart showing the steps to produce the scaled delay transition fault (SDTF) model, according to the present invention.

FIG. 19 is a flow chart showing the steps for producing a scaled delay transition fault (SDTF) model. One use for the SDTF model is to grade patterns to determine their efficacy in fortuitous fault coverage. In one embodiment, the SDTF model uses the rules from the transition fault model to determine propagation of a fault. The transition fault model rules are well known in the art.

Figure 21:
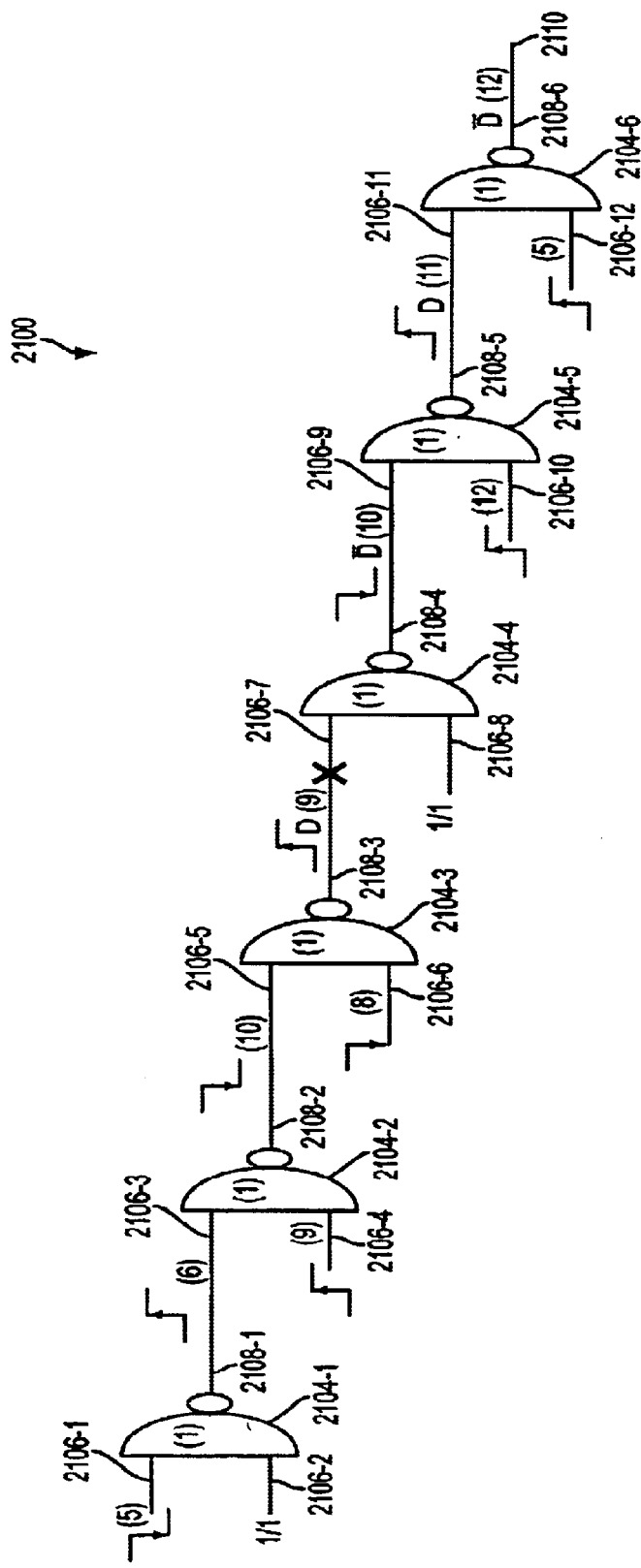
FIG. 21 is an exemplary circuit used to demonstrate the steps of FIG. 19.

The steps in FIG. 19 are performed with the delay calculation rules in FIGS. 20a and 20b on circuit 2100 of FIG. 21. FIGS. 20a and 20b are charts showing the rules by which delay metric values are calculated in the SDTF model. FIG. 21 is an exemplary circuit used to demonstrate the process of FIG. 19. While FIGS. 20a, 20b, and 21 are directed toward two-input gates, the SDTF model applies to gates with any number of inputs.

In FIG. 21, wire delays between gates 2104 are zero, for simplicity's sake. In another embodiment, however, one or more wire delays may be added to the delay assigned to the output pin to obtain the input pin delay. In FIG. 21, the number in parentheses above each wire is the total delay accumulated up to that point in the SDTF model delay calculation. The delay metric value of each gate is one, shown in parentheses in each gate 2104. Six gates 2104 are shown, from primary inputs 2106-1 and -2 to a primary output 2110. Primary inputs 2106-1 and -2 are controllable, as are other inputs not shown in circuit 2100 that either directly or indirectly lead to gates 2104-2 through 2104-4. An exemplary fault site is shown at input pin 2106-7, identified with an "X." This fault site would have previously been calculated by the steps depicted in FIG. 2 on circuit 2100 of FIG. 21. Gates 2104 represent the path along which the transition fault propagates from a fault site to a primary output. If an output transitions on an output pin in the fault free region of the path, then the input pins are examined for a number of possible conditions. Input values at input pin 2106-1 show a transition to a controlling value, represented by a high-to-low signal. Input values at input pin 2106-2 show a non-controlling value on both patterns of the two pattern sequence, represented by a "1/1". An output on output pin 2108-1 shows a transition to a non-controlling state or value, represented by a low-to-high signal, since output pin 2108-1 feeds a NAND gate.

FIG. 20a shows that in a fault free portion of a delay path, if one of the inputs of a gate receives an input that has a static controlling value, then propagation ceases. If one of the inputs of a gate has an input that has a static non-controlling value, then the delay value of a second input receiving an input which transitions is added to the gate delay value to obtain the delay value assigned to the output pin. If two or more input pins transition to controlling values (and the other input pins remain at non-controlling values over both patterns of a two-pattern sequence) then the lesser of the delays associated with the transitioning input pins is added to the gate delay value and assigned to the output pin. If two or more input pins transition to non-controlling values (and the other input pins remain at non-controlling values over both patterns of a two-pattern sequence), then the greater of the delays associated with the transitioning input pins is added to the gate delay value and assigned to the output pin. If two input pins receive separate inputs with opposite transitions (i.e., a first input transitioning to a controlling value in the second pattern of a two-pattern sequence and a second input transitions to a non-controlling value in the second pattern of a two-pattern sequence, or vice versa), then propagation ceases.

FIG. 20b shows that in a faulty delay portion of a delay path, if one of the inputs of a gate receives an input that has a static controlling value, then propagation ceases. If one of the inputs of a gate has an input that has a static non-controlling value, then the delay value of a second input receiving an input which is a controlling D or a non-controlling D is added with the gate delay value to obtain the delay value assigned to the output pin. If two or more input pins receive inputs that are controlling D values (and the other input pins remain at non-controlling values over both patterns of a two-pattern sequence), then the lesser of the delays associated with the transitioning input pins is added to the gate delay value and assigned to the output pin. If two or more input pins receive inputs that are non-controlling D values (and the other input pins remain at non-controlling values over both patterns of a two-pattern sequence), then the greater of the delays associated with the transitioning input pins is added to the gate delay value and assigned to the output pin. If two input pins receive separate inputs with opposite values (i.e., a first input is a controlling D value and a second input is a non-controlling D bar value, or a first input is a non-controlling D value and a second input is a controlling D bar value), then propagation ceases.

In FIGS. 20a and 20b, the two inputs are interchangeable because gate behavior is symmetrical. Interchanging the inputs pertains to simple two-input gates, such as AND, NAND, OR, and NOR, but can be extended to complex gates.

In FIG. 19, step 1900 determines whether the fault site is detected using transition fault modeling rules. According to transition fault modeling rules, step 1900 detects the fault site at input pin 2106-7. Step 1910 calculates the fault free delay from a controllable input to the fault site. Step 1910 uses the rules of FIG. 20a in its calculations. As mentioned above, primary inputs 2106-1 and -2 to gate 2104-1 are controllable. The input signals transition to a controlling value on input pin 2106-1, and a non-controlling value during both patterns on input pin 2106-2. According to FIG. 20a, the delay at the transition input should be added to the gate delay value and the sum assigned to the output pin. The delay at input pin 2106-1 is five and the delay of gate 2104-1 is one, so a delay value of six is assigned to output pin 2108-1 and further assigned to input pin 2106-3 (shown in parentheses).

Gate 2104-2 has input pins 2106-3 and -4, which each have transitions to non-controlling inputs. According to FIG. 20a, the greater of the transition delays should be added to the gate delay value. Therefore, because input pin 2106-4 has a delay value that is greater than that of input pin 2106-3, nine is added to the gate delay value of one, and a delay value of ten is assigned to output pin 2108-2 and input pin 2106-5.

Gate 2104-3 has input pins 2106-5 and -6, which each have transitions to controlling inputs. According to FIG. 20a, the lesser of the transition delays should be added to the gate delay. Therefore, because input pin 2106-6 has a delay value that is less than that of input pin 2106-5, eight is added to the gate delay value of one, and a delay value of nine is assigned to output pin 2108-3 and input pin 2106-7. Step 1910 is complete because the fault site is at input pin 2106-7.

Step 1920 calculates the faulty delay from the fault site to an observable destination. Step 1920 uses the rules of FIG. 20b in its calculations. Gate 2104-4 has input pins 2106-7 and -8. Input pin 2106-7 has a transition to a non-controlling value while input pin 2106-8 has a non-controlling value on both patterns of a two pattern sequence. Therefore, a D which is a 1 in a fault free machine and 0 in a faulty machine, is injected into input 2106-7. According to FIG. 20b, the delay at the injected fault site should be added to the gate delay value. Therefore, nine is added to the gate delay value of one, and a delay value of ten is assigned to output pin 2108-4 and input pin 2106-9.

Gate 2104-5 has input pins 2106-9 and -10, where the input pin 2106-10 transitions to a non-controlling input with a delay of 12. According to FIG. 20b, the on path pin 2106-9 has a D bar input while input pin 2106-10 has a non-controlling signal on the second of the two pattern sequence. Thus, the delay of the on path pin 2106-9 is added to the gate delay value resulting in a delay of 11 at the output pin 2108-5 and input pin 2106-11.

Gate 2104-6 has input pins 2106-11 and -12, where input pin 2106-11 receives the propagated D and pin 2106-12 has a transition to a non-controlling input. According to FIG. 20b, the on path D is propagated across the gate and the gate delay value is added. Thus a delay of 12 is posted on the output pin 2108-6, and primary output pin 2110. Step 1920 has reached an observable destination of primary output 2110 and is finished.

The path associated with the detection of the fault site at input 2106-7 in FIG. 21 is only one path upon which the fault site was detected in the SDTF model for a given two pattern sequence and not necessarily the only path over which the fault could be detected or the least-slack path through the fault site.

Step 1930 compares the SDTF delay of the path through the fault site to a maximum desirable delay metric value. In one embodiment, the maximum desirable delay metric value is the gate delay metric of the least slack path through the fault site. Step 1940 then marks the fault site as detected and records the SDTF delay. The steps for detected faults under the SDTF model are finished (step 1950).

Figure 23:
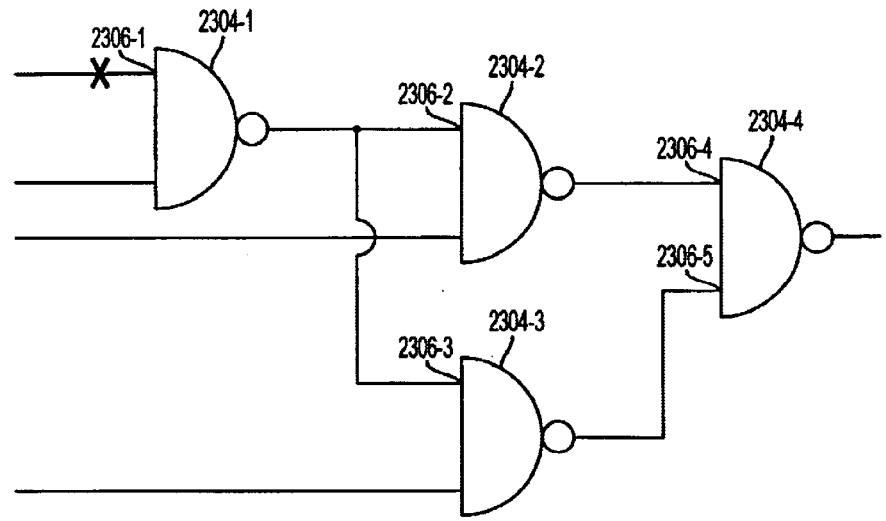
FIG. 23 is an exemplary circuit with reconvergent fanout used to demonstrate the delay calculations shown in FIG. 22.

FIG. 22 shows a simplified schematic diagram demonstrating an application of the rules defined in FIGS. 20a and 20b when calculating delay in the presence of reconvergent fanout. FIG. 23 is an exemplary circuit with reconvergent fanout used to demonstrate the delay calculations shown in FIG. 22. The fault site is at input pin 2306-1 of gate 2304-1. The faulty response from gate 2304-1 propagates to input pins 2306-2 and -3 of gates 2304-2 and -3, respectively. The faulty response then reconverges at gate 2304-4, through input pins 2306-4 and -5. There are two situations in which the delay for a reconvergent faulty input propagates, shown in FIG. 22. The nomenclature in FIG. 22 shows D 2250 and D bar 2252. D is a 1 in a fault free machine and a 0 in a faulty machine, and D bar is a 0 in a fault free machine and a 1 in a faulty machine. D and D bar are well-known in the art and in this case refer to faulty response propagation.

FIG. 22 calculates the delay of reconvergent faulty response for gate 2304-4 of FIG. 23. Gates 2204-1 and -2 each provide an example in which there is a reconvergent faulty response at the input pins. With respect to gate 2204-1 there is a D value at input pins 2206-1 and -2. According to the delay values associated with the input pins 2206-1 and -2 and output pin 2208-1, as well as the chart of FIG. 20b, the greater of the two delay values is added to the gate delay value and assigned to the output pin.

With respect to gate 2204-2, there is a D bar value on input pins 2206-3 and -4. According to the delay values assigned to input pins 2206-3 and -4 and output pin 2208-2 of gate 2204-2, as well as the chart of FIG. 20b, the lesser of the two delay values is added to the gate delay value and assigned to the output pin. The delay calculation rules of FIG. 20b apply when calculating the delay of faulty response propagation to include when a faulty response reconverges at a gate, as shown in FIG. 23, as recognized in the faulty delay calculation of step 1920 in FIG. 19. Otherwise, the delay calculation rules of FIG. 20a are followed for fault free delay value calculations.

Several facts about the transition fault model are of some importance to the present invention. First, a faulty response to a transition input (either slow to rise or slow to fall) can propagate to the output even though the transition does not propagate to the output. In other words, using a two input NAND gate as an example, if one input pin of the two input gate has a transition to a controlling value and the other input pin has a transition to a non-controlling value, then the steady state output is a 1 across both patterns of the two pattern sequence. Further, in order for a transition fault to be detected, a transition across both patterns of the two-pattern sequence must occur at the fault site. Since the output pin has no transition there is no detection of a transition fault at the output pin. Still further, on the second pattern of the two-pattern sequence the off path input pins must have non-controlling values for the transition fault site to allow propagation of the faulty response to the output pin of the NAND gate. Therefore, provided that the output pin is an observable destination or the fault effect successfully propagates from the output pin to an observable destination, the input pin that transitions to a controlling value is detected. The detection occurs in this instance because the other input pin is the only input pin with a non-controlling value during the second of the two-pattern sequence.

Figure 24:
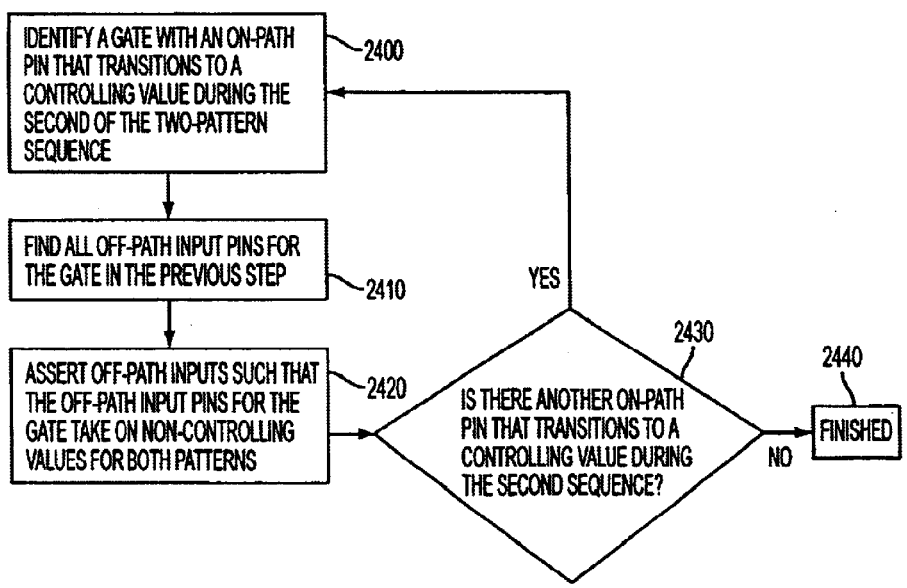
FIG. 24 is a flow chart showing the steps for an optimization using the SDTF model, according to the present invention.

FIG. 24 is a flow chart showing the steps for an optimization using the SDTF model. The steps of FIG. 24 may be applied to a collapsed fault list. A collapsed fault list is a subset of the complete fault list. In one embodiment, a complete fault list includes the input pins and output pins of every gate. One example of a collapsed fault list includes the input pins on all gates in a fanout-free region. If a fault is detected and marked in the collapsed fault list it is also detected and marked in the complete fault list.

Figure 25:
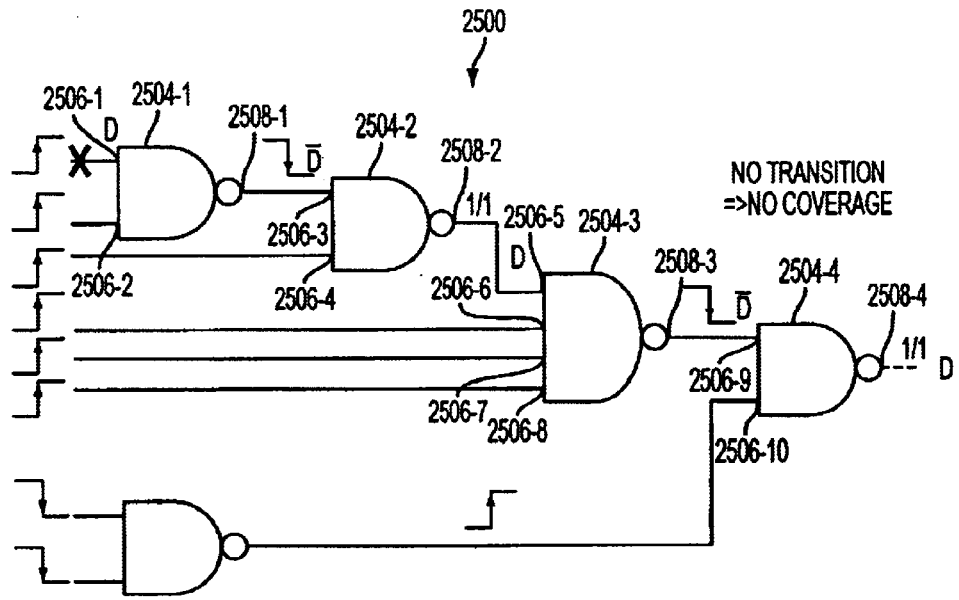
FIG. 25 is an exemplary circuit demonstrating non-optimized detection of transition faults using the rules of FIGS. 20a and 20b, according to the present invention.
Figure 26:
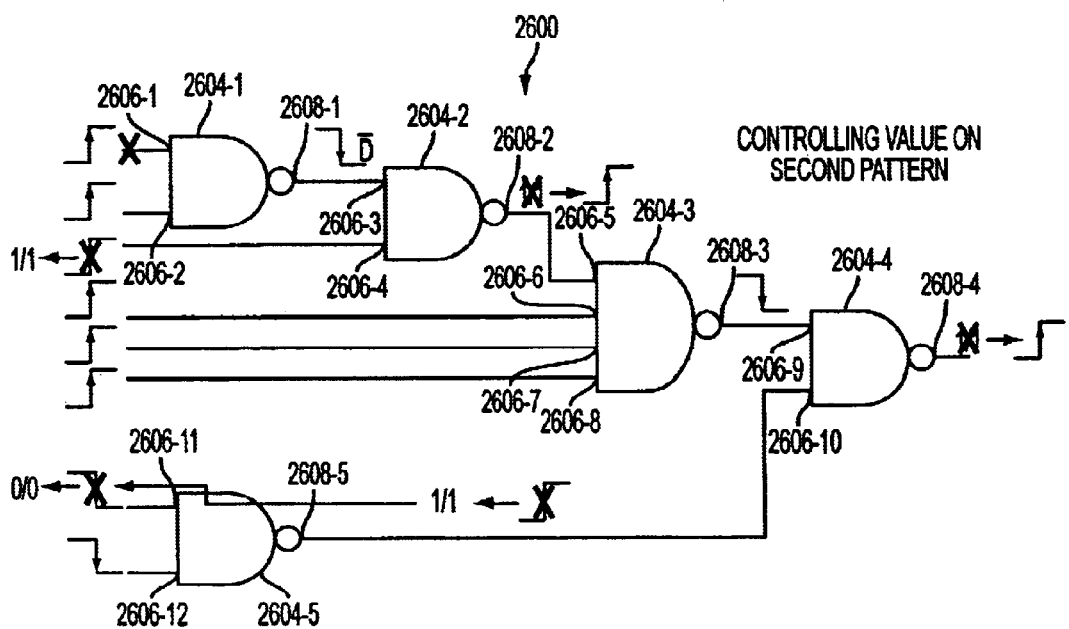
FIG. 26 is an exemplary circuit demonstrating detection of transition faults according to the optimization steps of FIG. 24, according to the present invention.

The steps of FIG. 24 further increase fortuitous detection of faults along a path within a fanout-free region, which is a path through gates in which each gate has a fanout of one. This fortuitous detection of faults is performed by manipulating signals at input pins to achieve a greater number of transition responses on output pins in the fanout-free region. The steps of FIG. 24 additionally recognize fortuitous coverage of some input pins based on transitions on the output pins. FIG. 25 is an exemplary circuit demonstrating the non-optimized detection of transition faults. FIG. 25 uses the rules of FIGS. 20a and 20b in its calculations. FIG. 26, on the other hand, is an exemplary circuit demonstrating detection of transition faults according to the optimization steps of FIG. 24.

FIG. 25 shows fault site and fortuitous coverage of exemplary circuit 2500. The input pins 2506 of circuit 2500 either transition to a controlling value or to a non-controlling value. The fault site is at input pin 2506-1, with the path following gates 2504-1 through 2504-4. Gate 2504-1, because it is a NAND gate, has a transition to a non-controlling value on input pins 2506-1 and -2, producing a faulty response and a transition at output pin 2508-1. The presence of a faulty response and a transition means that input pin 2506-1 is detected under the transition fault model and the SDTF model if output pin 2508-1 is an observable destination or propagates to an observable destination. Fortuitous fault coverage includes output pin 2508-1 as detected and output pin 2508-1 is marked as detected and removed from consideration.

Gate 2504-2 has a transition to a controlling value on input pin 2506-3 and a transition to a non-controlling value on input pin 2506-4, resulting in a non-controlling value across both patterns on output pin 2508-2. Because there was a non-controlling value on the second pattern of the two pattern sequence on input pin 2506-4, fortuitous fault coverage includes input pin 2506-3 as detected if output pin 2508-1 is an observable destination or propagates to an observable destination. Because output pin 2508-2 does not transition there is no fortuitous fault coverage on that pin.

Gate 2504-3 has a non-controlling value for both patterns on input pin 2506-5 and a transition to a non-controlling value on input pins 2506-6 through 2506-8, resulting in a transition to a controlling value on output pin 2508-3. Because there is no transition on input pin 2506-5, there is no fortuitous detection of a transition fault on input pin 2506-5.

A successful propagation of a transition fault is shown at input pin 2506-1. If the injected zero arrives at an observable destination, the transition fault at input pin 2506-1 is detected as defined by the requirements of the transition fault model. This innovation identifies that transition faults at output pins 2508-1 and -3, as well as input pins 2506-3 and -9, are also detected since the requirements of the transition fault model are satisfied for transition faults on such pins. Further, because there is a transition on output pin 2508-3 and there is successful propagation of a faulty response to an observable destination, there is fortuitous coverage of the transition fault on that pin and it can be marked as detected in the complete fault list.

With respect to gate 2504-4, a transition to a non-controlling value occurs on input pin 2506-9, and a transition to a controlling value on input pin 2506-10 yields a logic one across both patterns on output pin 2508-4. Because there is a transition on input pin 2506-9 and there is a non-controlling value on the second pattern of the two pattern sequence on input pin 2506-10, there is fortuitous coverage of a transition fault at input pin 2506-9. Finally, there is no fortuitous fault coverage of output pin 2508-4 because there is no transition on that pin.

In summary, input pin 2506-1 is the fault site and is marked as detected, while fortuitous coverage exists on input pins 2506-3 and -9, and on output pins 2508-1 and -3.

FIG. 24 optimizes the detection of transition faults shown for circuit 2500 of FIG. 25. FIG. 24 is used in conjunction with the exemplary circuit of FIG. 26, which is similar to the circuit of FIG. 25. The steps of FIG. 24 increase the fortuitous coverage of FIG. 25 to include each input and output pin on the path of the fault site at input pin 2506-1 to output pin 2508-4.

Step 2400 identifies a gate with an on-path pin that transitions to a controlling value during the second of the two-pattern sequence after input signals are applied to the input pins of circuit 2600. Gate 2604-2 has input pin 2606-3 that transitions to a controlling value (high-to-low) during the second of the two-pattern sequence. Step 2410 finds all off-path input pins for the gate in step 2400. Input pin 2606-4 is the only off-path input pin of gate 2604-2. Step 2420 asserts off-path inputs such that the off-path input pins identified in step 2410 take on non-controlling values for both patterns of the two pattern sequence. In one embodiment, step 2420 is implemented by asserting non-controlling values directly to the off-path input pins. In another embodiment, a signal is asserted at off-path input pins at the gate which eventually provide a non-controlling value for both patterns of the two-pattern sequence at the desired input pin. For example, at input pin 2606-4 the injected value is changed from a transition to a non-controlling value during the second of the two-pattern sequence to a non-controlling value during both patterns of the sequence. According to transition fault model rules, a transition to a controlling value (at input pin 2606-3) and a non-controlling value during both patterns of the sequence (at input pin 2606-4) produce a transition to a non-controlling value at output pin 2608-2, since output pin 2608-2 feeds a NAND gate. Therefore, output pin 2608-2 has a transition and is detected and removed from consideration. Furthermore, input pin 2606-5 has a transition and all off-path input pins (input pins 2606-6 through 2606-8) have non-controlling values on the second pattern of the two-pattern sequence. Therefore, input pin 2606-5 is detected and removed from consideration.

Step 2430 determines whether there is another pin that transitions to a controlling value during the second of the two pattern sequence. Step 2400 again identifies a gate with an on-path pin that transitions to a controlling value during the second of the two-pattern sequence. The input to input pin at gate 2604-4 transitions to a controlling value during the second of the two-pattern sequence. In step 2410, input pin 2606-10 is the only off-path input pin for gate 2604-3. Step 2420 injects a controlling value across both patterns on an input pin of gate 2604-4, so that input pins for the gate take on non-controlling values for both patterns of the two pattern sequence. Injecting zero (a controlling value) across both patterns at input pin 2606-11 yields a one for both patterns (a non-controlling value) at output pin 2608-5, since output pin 2608-5 feeds a NAND gate. Different gates require different input values to achieve a non-controlling output value where they feed a NAND gate. The circuit 2600 of FIG. 26 is only one example that illustrates the steps of FIG. 24. The non-controlling value across both patterns at output pin 2608-5, since output pin 2608-5 feeds a NAND gate, propagates to input pin 2606-10. A transition to a controlling value at input pin 2606-9 and a non-controlling value across both patterns of the two-pattern sequence at input pin 2606-10 yields a transition to a non-controlling value at output pin 2608-4. Output pin 2608-4 has a transition, and the associated transition fault can therefore be marked as detected. At step 2430, there are no more on-path pins that transition to a controlling value during the second of the two-pattern sequence, so the process is finished (step 2440).

In summary, the method for optimizing the SDTF model, as depicted by the steps of FIG. 24, cause each on-path input and output pin, in the fanout free region illustrated in FIG. 26 to be marked as detected under the transition fault model and SDTF model rules.

The SDTF model works in conjunction with optimization provided by the steps in FIG. 24 for the following reasons. Under the SDTF model, a fault site on a path with a delay sufficiently near the delay of the least slack path will be marked as detected. If the fault site leads to a fanout-free region then all on-path pins (in the fanout-free region) should also be on a path with a delay sufficiently near the delay of the least slack path through each of those pins. Incorporating the steps of FIG. 24 during testing allows all the on-path pins in the fanout-free region to be marked as detected when the injected faulty response is successfully propagated from the output of the fanout-free region to an observable destination. These steps both speed up the test development process and provide a qualitative measurement.

Figure 27:
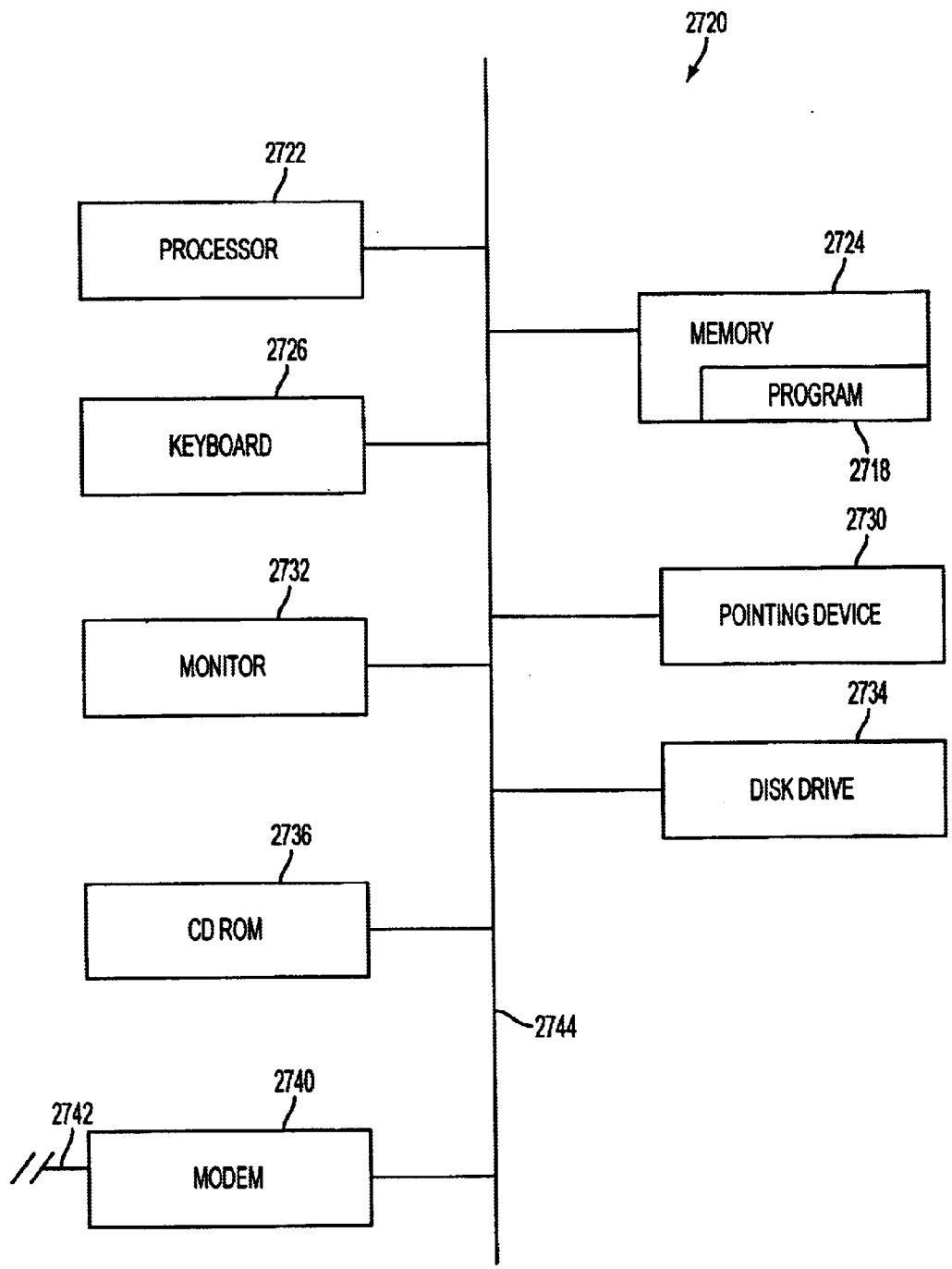
FIG. 27 is a high level block diagram of an exemplary server or computer that may be used with the present invention.

FIG. 27 is a high level block diagram of an exemplary server or computer 2720 which may be used with the present invention. FIG. 27 shows one embodiment of the present invention, which is the method of the present invention implemented in a computer readable medium, such as a computer program 2718. The computer program 2718 is executed on the server or computer 2720. Computer 2720 includes a processor 2722, which utilizes a central processing unit (CPU) and supporting integrated circuitry. The computer 2720 includes memory 2724, which is any type or combination of memory, including fast semiconductor memory (e.g., RAM, NVRAM or ROM), slower magnetic memory (e.g., hard disk storage), optical memory and substantially any conventional memory known in the art. Memory 2724 facilitates storage of the computer program 2718 and the operating system software. The computer 2720 may also include interface devices including, but not limited to, keyboard 2726, pointing device 2730, and monitor 2732, all of which allow a user to interact with computer 2720. Mass storage devices, such as disk drive 2734 and CD ROM 2736 may also be included in computer 2720 for storage of information. The computer 2720 may communicate with other computers and/or networks via modem 2740 and telephone line 2742 to allow for remote operation or to utilize files stored at different locations. Other media may also be used in place of modem 2740 and telephone line 2742, such as a direct connection, high speed data line, or a wireless connection. The components described above may be operatively connected by a communications bus 2744. Alternatively, the components may be operatively connected by wireless communication.

The foregoing descriptions of specific embodiments and best mode of the present invention have been presented for purposes of illustration and description. They are not intended to be exhaustive or to limit the present invention to the precise forms disclosed, and various modifications and variations are possible in light of the above description. The embodiments were chosen and described to best explain the principles of the present invention and its practical application, to thereby enable others skilled in the art to best utilize the present invention and various embodiments with various modifications as are suited to the particular use contemplated. It is intended that the scope of the present invention be defined by the claims appended hereto and their equivalents.

What is claimed is:

1. A method to produce a set of vectors for use in testing a digital integrated circuit (IC) having a plurality of gates, each gate having at least one input pin and one output pin, each said pin definable as a fault site and said IC is definable as having branch depths and branch widths, the method comprising:

for each said fault site, determining a delay metric that identifies the longest delay accumulated in a forward direction and in a reverse direction through said IC;

wherein said delay metric is obtained by calculating and assigning an accumulated forward direction delay value and an accumulated reverse direction delay value through each said fault site for each said gate;

for each said fault site, summing accumulated forward direction delay value and reverse direction delay value to provide a measure of maximum delay through each said fault site in said IC;

wherein data associated with said measure of maximum delay is useable to define a longest physical path through said IC associated with said maximum delay; and iteratively using a set of longest physical paths defined by said measure of maximum delay to generate said set of vectors;

wherein said set of vectors is useable by a tester apparatus to physically test said IC.

2. The method of claim 1, further including:

for each said fault site for each said gate, calculating and assigning a value for at least one of branch depth and branch width.

3. The method of claim 1, further including:

sorting each said fault site according to magnitude of said measure of maximum delay to create a fault list of as yet undetected faults;

wherein said fault list is a list of each said fault site in said IC.

4. The method of claim 1, further including:

for each said fault site, calculating and assigning a value for at least one of branch depth and branch width.

5. The method of claim 4, further including:

sorting each said fault site according to magnitude of said measure of maximum delay to create a fault list of as yet undetected faults;

wherein said fault list is a list of each said fault site in said IC.

6. The method of claim 1, further including:

sorting each said fault site according to magnitude of said measure of maximum delay to create a fault list that includes each said fault site in said IC;

wherein said iteratively using a set of longest physical paths defined by said measure of maximum delay to generate said set of vectors includes:
providing said set of vectors as input to a scaled delay transition fault (SDTF) simulator that marks faults on said fault list that are detected by said set of vectors;
creating a vector file that includes a list of each of said vectors that produced a detected said fault in said IC;
continuing to so use said set of longest physical paths until every fault in said fault list has been detected or at least attempted to be detected.

7. The method of claim 6, further including:

selecting a said fault from said fault list;

using a said longest path associated with a selected said fault to generate said set of vectors;

wherein said SDTF can fortuitously detect faults other than a fault associated with said longest path.

8. The method of claim 1, further including:

sorting each said fault site according to magnitude of said measure of maximum delay to create a fault list that includes each said fault site in said IC;

using said physical path to generate said set of vectors; and providing said set of vectors as input to a scaled delay transition fault simulator that marks faults on said fault list that are detected by said set of vectors and that associates a delay with each detected said fault.

9. A method to acquire raw data for a digital integrated circuit (IC) having a plurality of gates, each gate having at least one input pin and one output pin, each said pin definable as a fault site, the method comprising:

for each said fault site, determining a delay metric that identifies the longest delay accumulated in a forward direction and in a reverse direction through said IC;

storing each said delay metric so determined;

wherein data included in stored delay metrics permits determining longest physical paths through said fault sites in said IC without incurring excessive runtime analysis.

10. A computer readable medium wherein is stored a computer routine that upon execution by a computer system produces a set of vectors for use in testing a digital integrated circuit (IC) having a plurality of gates, each gate having at least one input pin and one output pin, each said pin definable as a fault site and said IC is definable as having branch depths and branch widths, the computer routine upon execution carrying out the following steps:

for each said fault site, determining a delay metric that identifies the longest delay accumulated in a forward direction and in a reverse direction through said IC;

wherein said delay metric is obtained by calculating and assigning an accumulated forward direction delay value and an accumulated reverse direction delay value through each said fault site for each said gate;

for each said fault site, summing accumulated forward direction delay value and reverse direction delay value to provide a measure of maximum delay through each said fault site in said IC;

wherein data associated with said measure of maximum delay is useable to define a longest physical path through said IC associated with said maximum delay; and iteratively using a set of longest physical paths defined by said measure of maximum delay to generate said set of vectors;

wherein said set of vectors is useable by a tester apparatus to physically test said IC.

11. The software routine of claim 10, further including:
for each said fault site for each said gate, calculating and assigning a value for at least one of branch depth and branch width.

12. The software routine of claim 10, further including:
sorting each said fault site according to magnitude of said measure of maximum delay to create a fault list of as yet undetected faults;

wherein said fault list is a list of each said fault site in said IC.

13. The software routine of claim 10, further including;
for each said fault site, calculating and assigning a value for at least one of branch depth and branch width.

14. The software routine of claim 13, further including:
sorting each said fault site according to magnitude of said measure of maximum delay to create a fault list of as yet undetected faults;

wherein said fault list is a list of each said fault site in said IC.

15. The software routine of claim 13, further including:
sorting each said fault site according to magnitude of said measure of maximum delay to create a fault list that includes each said fault site in said IC;

wherein said iteratively using a set of longest physical paths defined by said measure of maximum delay to generate said set of vectors includes:

providing said set of vectors as input to a scaled delay transition fault (SDTF) simulator that marks faults on said fault list that are detected by said set of vectors;

creating a vector file that includes a list of each of said vectors that produced a detected said fault in said IC;

continuing to so use said set of longest physical paths until every fault in said fault list has been detected or at least attempted to be detected.

16. The software routine of claim 15, further including:
selecting a said fault from said fault list;

using a said longest path associated with a selected said fault to generate said set of vectors;

wherein said SDTF can fortuitously detect faults other than a fault associated with said longest path.

17. The software method of claim 10, further including:
sorting each said fault site according to magnitude of said measure of maximum delay to create a fault list that includes each said fault site in said IC;

using said physical path to generate said set of vectors; and providing said set of vectors as input to a scaled delay transition fault simulator that marks faults on said fault list that are detected by said set of vectors and that associates a delay with each detected said fault.

18. A computer readable medium wherein is stored a computer routine that upon execution by a computer system acquires raw data for a digital integrated circuit (IC) having a plurality of gates, each gate having at least one input pin and one output pin, each said pin definable as a fault site, the computer routine upon execution carrying out the following steps:

for each said fault site, determining a delay metric that identifies the longest delay accumulated in a forward direction and in a reverse direction through said IC;

storing each said delay metric so determined;

wherein data included in stored delay metrics permits determining longest physical paths through said fault sites in said IC without incurring excessive runtime analysis.

19. The computer routine of claim 18, further including storing for each said fault site said delay metric;

wherein stored said delay metric data enables determination of longest physical paths without re-analysis of said IC.

20. An apparatus to produce a set of vectors for use in testing a digital integrated circuit (IC) having a plurality of gates, each gate having at least one input pin and one output pin, each said pin definable as a fault site and said IC definable as having branch depths and branch widths, the apparatus including:

for each said fault site, means for determining a delay metric that identifies the longest delay accumulated in a forward direction and in a reverse direction through said IC;

wherein said delay metric is obtained by calculating and assigning an accumulated forward direction delay value and an accumulated reverse direction delay value through each said fault site for each said gate;

for each said fault site, means for summing accumulated forward direction delay value and reverse direction delay value to provide a measure of maximum delay through each said fault site in said IC;

wherein data associated with said measure of maximum delay is useable to define a longest physical path through said IC associated with said maximum delay; and means for iteratively using a set of longest physical paths defined by said measure of maximum delay to generate said set of vectors;

wherein said set of vectors is useable by a tester apparatus to physically test said IC.

21. The apparatus of claim 20, further including:
for each said fault site for each said gate, means for calculating and assigning a value for at least one of branch depth and branch width.

22. The apparatus of claim 20, further including:

means for sorting each said fault site according to magnitude of said measure of maximum delay to create a fault list of as yet undetected faults;

wherein said fault list is a list of each said fault site in said IC.

23. The apparatus of claim 20, further including;

for each said fault site, means for calculating and assigning a value for at least one of branch depth and branch width.

24. The apparatus of claim 23, further including:

means for sorting each said fault site according to magnitude of said measure of maximum delay to create a fault list of as yet undetected faults;

wherein said fault list is a list of each said fault site in said IC.

25. The apparatus of claim 23, further including:

means for sorting each said fault site according to magnitude of said measure of maximum delay to create a fault list that includes each said fault site in said IC;

wherein said iteratively using a set of longest physical paths defined by said measure of maximum delay to generate said set of vectors includes:

means for providing said set of vectors as input to a scaled delay transition fault (SDTF) simulator that marks faults on said fault list that are detected by said set of vectors;

creating a vector file that includes a list of each of said vectors that produced a detected said fault in said IC;

means for continuing to so use said set of longest physical paths until every fault in said fault list has been detected or at least attempted to be detected.

26. The apparatus of claim 25, further including:

means for selecting a said fault from said fault list; and means for using a said longest path associated with a selected said fault to generate said set of vectors;

wherein said SDTF can fortuitously detect faults other than a fault associated with said longest path.

27. The apparatus of claim 20, further including:

means for sorting each said fault site according to magnitude of said measure of maximum delay to create a fault list that includes each said fault site in said IC;

means for using said physical path to generate said set of vectors; and means for providing said set of vectors as input to a scaled delay transition fault simulator that marks faults on said fault list that are detected by said set of vectors and that associates a delay with each detected said fault.

\* \* \* \* \*